United States Patent
De Andrade Tabarani Santos et al.

(10) Patent No.: US 12,047,090 B2
(45) Date of Patent: Jul. 23, 2024

(54) METHODS AND DEVICES FOR REDUCING POWER CONSUMPTION AND INCREASING FREQUENCY OF OPERATIONS IN DIGITAL TO ANALOG CONVERTERS

(71) Applicant: Intel Corporation, Santa Clara, CA (US)

(72) Inventors: Filipe De Andrade Tabarani Santos, Kirchseeon (DE); Andreas Roithmeier, Munich (DE); Timo Gossmann, Neubiberg (DE); Syed Ahmed Aamir, Munich (DE); Rinaldo Zinke, Munich (DE)

(73) Assignee: INTEL CORPORATION, Santa Clara, CA (US)

( * ) Notice: Subject to any disclaimer, the term of this patent is extended or adjusted under 35 U.S.C. 154(b) by 94 days.

(21) Appl. No.: 17/635,001

(22) PCT Filed: Sep. 27, 2019

(86) PCT No.: PCT/US2019/053339
§ 371 (c)(1),
(2) Date: Feb. 14, 2022

(87) PCT Pub. No.: WO2021/061144
PCT Pub. Date: Apr. 1, 2021

(65) Prior Publication Data
US 2022/0294465 A1    Sep. 15, 2022

(51) Int. Cl.
*H03M 1/00* (2006.01)
*H03F 3/20* (2006.01)
*H03M 1/66* (2006.01)

(52) U.S. Cl.
CPC .............. *H03M 1/662* (2013.01); *H03F 3/20* (2013.01); *H03F 2200/451* (2013.01)

(58) Field of Classification Search
CPC ......... H03F 2200/451; H03F 2200/336; H03F 3/245; H03F 1/0227; H03F 1/3241;
(Continued)

(56) References Cited

U.S. PATENT DOCUMENTS

| 6,621,433 | B1 * | 9/2003 | Hertz | G01R 33/3621 |
| | | | | 324/309 |
| 8,724,761 | B2 * | 5/2014 | Bae | H04L 7/042 |
| | | | | 375/359 |

(Continued)

FOREIGN PATENT DOCUMENTS

WO    2018132006 A1    7/2018

OTHER PUBLICATIONS

Zhiming et al., "A Dual-Band Digital-WIFI 802.1 1a/b/g/n Transmitter SoC with Digital I/Q Combining and Diamond Profile Mapping for Compact Die Area and Improved Efficiency in 40 nm CMOS", 2016 IEEE International Solid-State Circuits, Feb. 2, 2016, 3 pages, ISSCC 2016, Session 9. (Year: 2016).*

(Continued)

*Primary Examiner* — Linh V Nguyen
(74) *Attorney, Agent, or Firm* — VIERING, JENTSCHURA & PARTNER mbB

(57) ABSTRACT

A RFDAC comprising an array of unit-cell power amplifiers, wherein the array comprises a first plurality of unit-cell power amplifiers, a second plurality of unit-cell power amplifiers, and a third plurality of unit-cell power amplifiers; wherein the first plurality of unit-cell power amplifiers are configured to operate in accordance with a first clock; wherein the second plurality of unit-cell power amplifiers are configured to operate in accordance with a second clock; wherein the third plurality of unit-cell power amplifiers are configured to operate in accordance with the first clock or the second clock. The RFDAC also comprising a decoder
(Continued)

configured to output the first clock and an enablement signal of the first clock for the first plurality; output the second clock and an enablement signal of the second clock for the second plurality; distinguish between the first clock and the second clock for the third plurality.

20 Claims, 17 Drawing Sheets

(58) Field of Classification Search
CPC ......... H03F 1/0288; H03F 2203/21106; H03F 3/211; H03F 1/0277; H03F 1/0261; H03F 1/0222; H03F 1/3223; H03F 1/3247; H03F 2201/3233; H03F 3/191; H03F 3/72; H03F 2201/3215; H03F 3/20; H03F 2203/21139; H03F 1/32; H03F 3/68; H03F 3/602; H03F 3/24; H03M 1/662; H03M 1/745; H03M 1/747
USPC ............................ 341/144; 330/10, 149, 136
See application file for complete search history.

(56) References Cited

U.S. PATENT DOCUMENTS

| 8,928,401 | B2* | 1/2015 | Verlinden | H03F 3/211 |
| | | | | 330/124 R |
| 9,154,150 | B1* | 10/2015 | Wu | H03M 1/1215 |
| 9,337,874 | B1 | 5/2016 | Yu et al. | |
| 11,211,900 | B2* | 12/2021 | Carvalho | H03F 3/68 |
| 2004/0125888 | A1* | 7/2004 | Cho | H03C 3/40 |
| | | | | 375/298 |
| 2012/0027127 | A1* | 2/2012 | Kato | H03F 3/245 |
| | | | | 330/251 |
| 2013/0271221 | A1* | 10/2013 | Levesque | H03F 3/19 |
| | | | | 330/294 |
| 2014/0211870 | A1 | 7/2014 | Dufrene et al. | |
| 2014/0300426 | A1 | 10/2014 | Mu et al. | |
| 2014/0348217 | A1* | 11/2014 | Hsieh | H03F 3/2178 |
| | | | | 375/219 |
| 2016/0276986 | A1* | 9/2016 | Anderson | H03F 3/245 |
| 2018/0183387 | A1 | 6/2018 | Schemmann et al. | |
| 2020/0099338 | A1* | 3/2020 | Han | H03F 3/45179 |
| 2020/0112471 | A1* | 4/2020 | Mehrpoo | H04B 1/04 |
| 2020/0153464 | A1* | 5/2020 | Yoo | H03F 1/32 |

OTHER PUBLICATIONS

Deng, Zhiming et al., "A Dual-Band Digital-WIFI 802.11a/b/g/n Transmitter SoC with DigitalI/Q Combining and Diamond Profile Mapping for Compact Die Area and Improved Efficiency in 40 nm CMOS", 2016 IEEE International Solid-State Circuits, Feb. 2, 2016, 3 pages, ISSCC 2016, Session 9.

Chen, Lei; "High Efficiency IQ-sharing Transmitter"; https://repository.tudelft.nl/islandora/object/uuid:db91743a-d644-4a80-aea6-d9709ba366f1/datastream/OBJ/download; 2016; 80 pages.

Extended Search Report issued for the European patent application No. 19947302.6, dated Jun. 5, 2016, 14 pages (for informational purposes only).

International Search Report issued for the corresponding international patent application No. PCT/US2019/053339, dated Jun. 24, 2020, 2 pages (for informational purposes only).

* cited by examiner

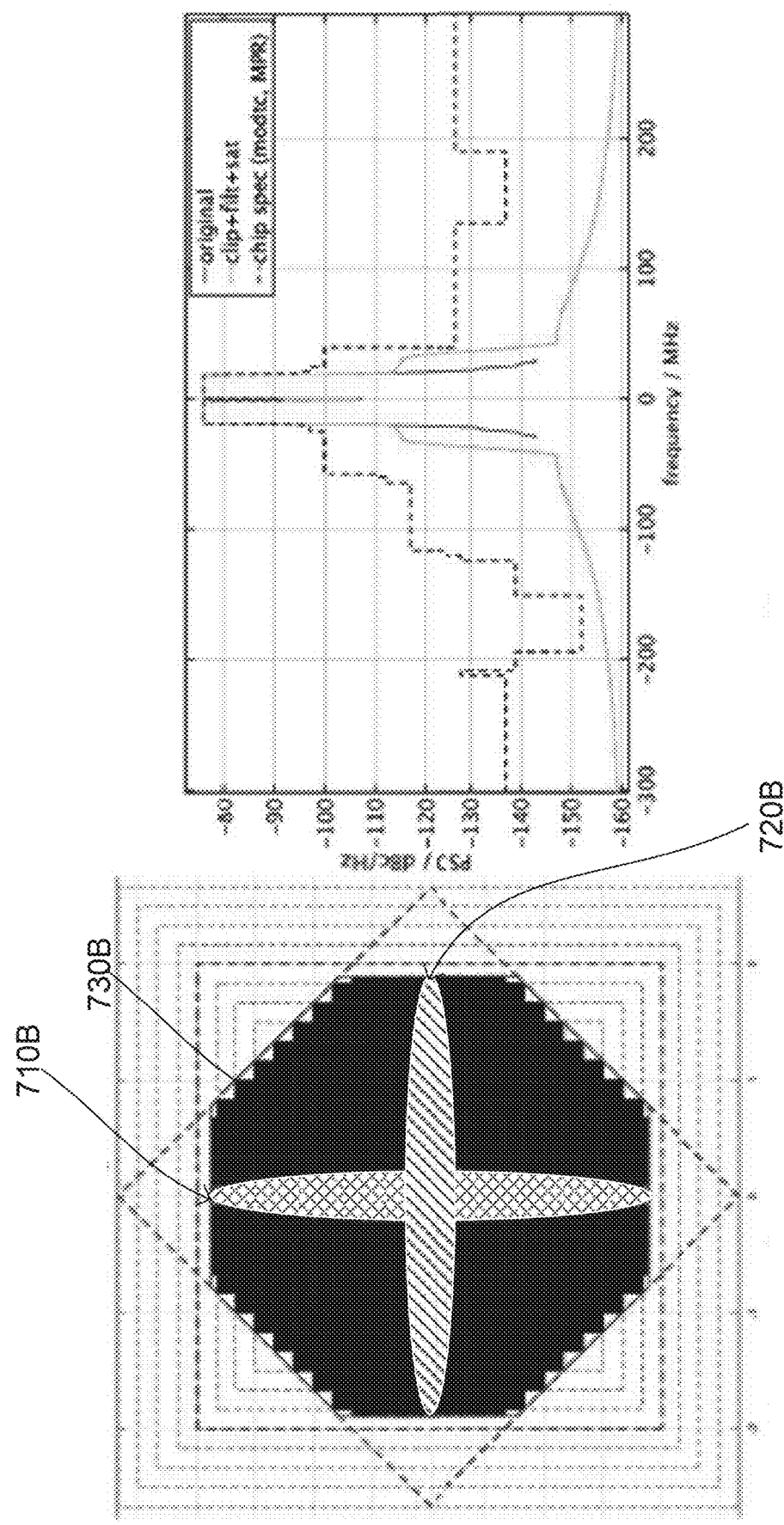

US 12,047,090 B2

METHODS AND DEVICES FOR REDUCING POWER CONSUMPTION AND INCREASING FREQUENCY OF OPERATIONS IN DIGITAL TO ANALOG CONVERTERS

CROSS-REFERENCE TO RELATED APPLICATIONS

This application is a national phase of International Application PCT/US2019/053339, which was filed on Sep. 27, 2019, the entire contents of which are incorporated herein by reference.

TECHNICAL FIELD

Various aspects of this disclosure relate generally to methods and devices for transmit beamsweeping with payload data.

BACKGROUND

Radio Frequency (RF) output signals may be generated using a Radio Frequency Digital-to-Analog Converter (RFDAC). RFDAC presents itself as an alternative to the usual radio frequency transmit chain, which includes digital-to-analog converters, baseband filters, up-converting mixer and power amplifier. RFDAC architecture uses an array of small unit-cell power amplifiers that are conditionally connected in parallel according to a digital code. A line and a column decoder ensures that the correct number of unit-cells are activated and their output power is combined into the matching network. For example, an RFDAC may use polar architecture or in-phase and quadrature (IQ) architecture. A polar RFDAC may use all cells to generate an output signal. Polar RFDACs may require broader bandwidth to transmit the same data rate as compared to IQ architecture. IQ transmitter lineups have two DACs, one for the in-phase I path, and one for the quadrature Q path. IQ architecture may suffer from lower efficiency and lower output power. It is desired to improve the transmitter efficiency.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of this disclosure are described with reference to the following drawings, in which:

FIGS. 7A-7C show simulation results according to some aspects.

DESCRIPTION

Figure 1:
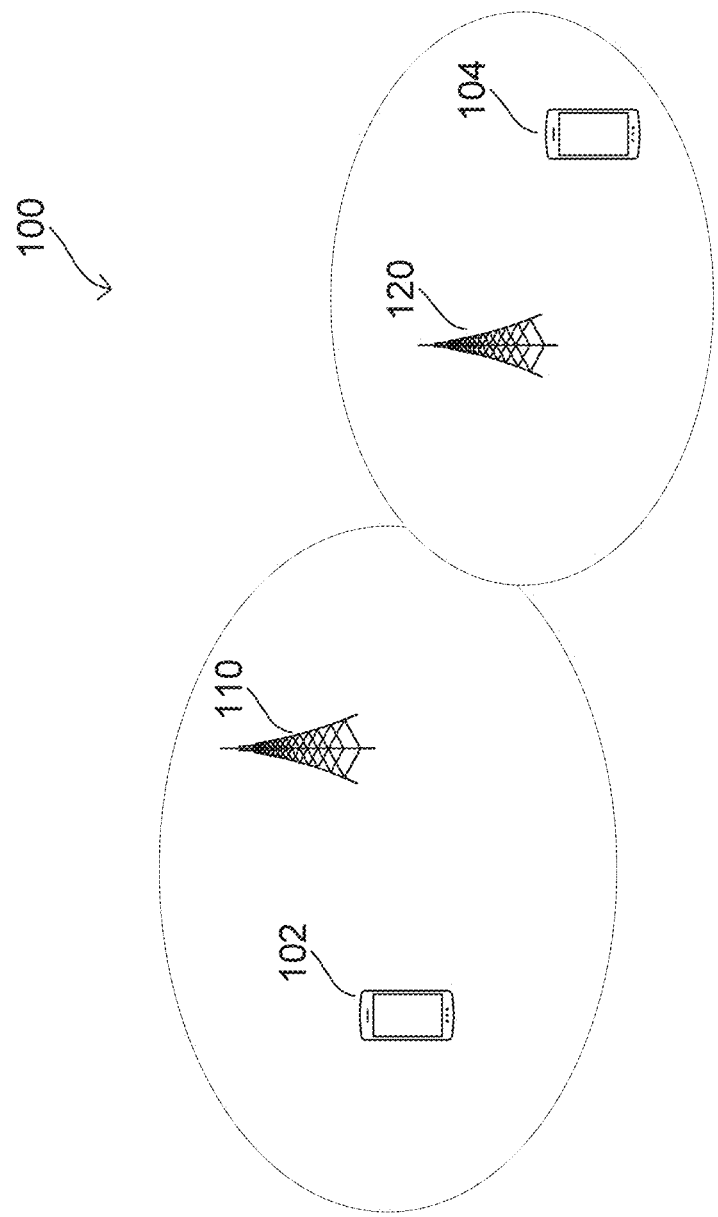
FIG. 1 shows an exemplary radio communication network according to some aspects.

The following detailed description refers to the accompanying drawings that show, by way of illustration, specific details and aspects in which the invention may be practiced.

The word "exemplary" is used herein to mean "serving as an example, instance, or illustration". The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

As used herein, "memory" is understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" refers to any type of executable instruction, including firmware.

The term "terminal device" utilized herein refers to user-side devices (both portable and fixed) that can connect to a core network and/or external data networks via a radio access network. "Terminal device" may include any mobile or immobile wireless communication device, including User Equipments (UEs), Mobile Stations (MSs), Stations (STAs), cellular phones, tablets, laptops, personal computers, wearables, multimedia playback and other handheld or body-mounted electronic devices, consumer/home/office/commercial appliances, vehicles, and any other electronic device capable of user-side wireless communications.

The term "network access node" as utilized herein refers to a network-side device that provides a radio access network with which terminal devices can connect and exchange information with a core network and/or external data networks through the network access node. "Network access nodes" can include any type of base station or access point, including macro base stations, micro base stations, NodeBs, evolved NodeBs (eNBs), gNodeBs, Home base stations, Remote Radio Heads (RRHs), relay points, Wi-Fi/WLAN Access Points (APs), Bluetooth master devices, DSRC RSUs, terminal devices acting as network access nodes, and any other electronic device capable of network-side wireless communications, including both immobile and mobile devices (e.g., vehicular network access nodes, moving cells, and other movable network access nodes). As used herein, a "cell" in the context of telecommunications may be understood as a sector served by a network access node. Accordingly, a cell may be a set of geographically co-located antennas that correspond to a particular sectorization of a network access node. A network access node can thus serve one or more cells (or sectors), where the cells are characterized by distinct communication channels.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. For purposes of this disclosure, radio communication technologies may be classified as one of a Short Range radio communication technology or Cellular Wide Area radio communication technology. Short Range radio communication technologies may include Bluetooth, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UMTS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMax), 5G New Radio (NR), for example, and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers.

Figure 2:
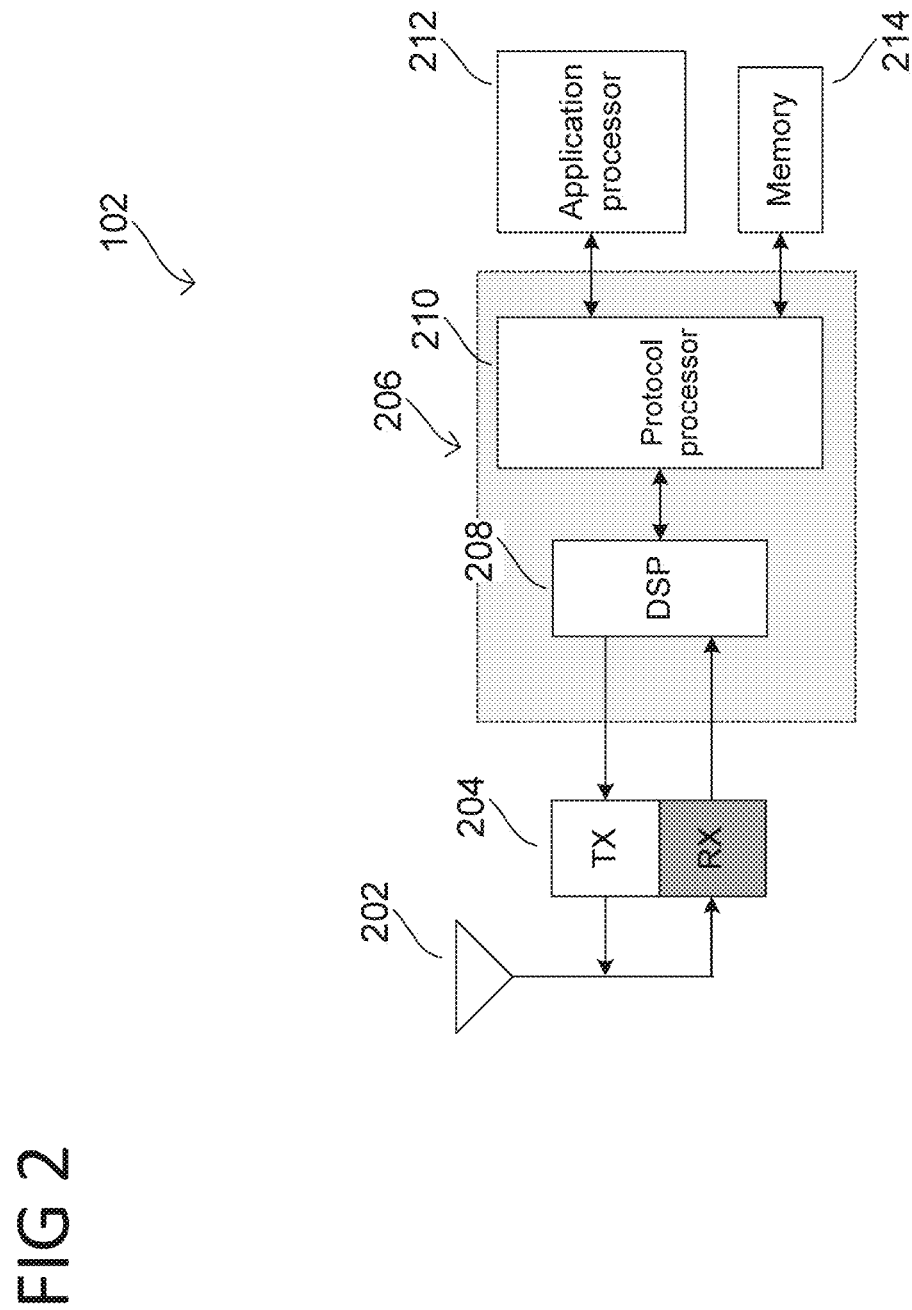
FIG. 2 shows an exemplary internal configuration of a terminal device according to some aspects.

FIG. 1 and FIG. 2 depict an exemplary network and device architecture for wireless communications. Starting with FIG. 1, FIG. 1 shows exemplary radio communication network 100 according to some aspects, which may include terminal devices 102 and 104 and network access nodes 110 and 120. Radio communication network 100 may communicate with terminal devices 102 and 104 via network access nodes 110 and 120 over a radio access network. Although certain examples described herein may refer to a particular radio access network context (e.g., LTE, UMTS, GSM, other 3rd Generation Partnership Project (3GPP) networks, WLAN/WiFi, Bluetooth, 5G NR, mmWave, etc.), these examples may be applied to any other type or configuration of radio access network. The number of network access nodes and terminal devices in radio communication network 100 is exemplary and is scalable to any amount.

In an exemplary cellular context, network access nodes 110 and 120 may be base stations (e.g., eNodeBs, NodeBs, Base Transceiver Stations (BTSs), or any other type of base station), while terminal devices 102 and 104 may be cellular terminal devices (e.g., Mobile Stations (MSs), User Equipments (UEs), or any type of cellular terminal device). Network access nodes 110 and 120 may therefore interface (e.g., via backhaul interfaces) with a cellular core network such as an Evolved Packet Core (EPC, for LTE), Core Network (CN, for UMTS), or other cellular core networks. The cellular core network may also be considered part of radio communication network 100. The cellular core network may interface with one or more external data networks. In an exemplary short-range context, network access node 110 and 120 may be access points (APs, e.g., WLAN or WiFi APs), while terminal device 102 and 104 may be short range terminal devices (e.g., stations (STAs)). Network access nodes 110 and 120 may interface (e.g., via an internal or external router) with one or more external data networks.

Network access nodes 110 and 120 may accordingly provide a radio access network to terminal devices 102 and 104 (and, optionally, other terminal devices of radio communication network 100 not explicitly shown in FIG. 1). In an exemplary cellular context, the radio access network provided by network access nodes 110 and 120 may enable terminal devices 102 and 104 to wirelessly access the core network via radio communications. The core network may provide switching, routing, and transmission, for traffic data related to terminal devices 102 and 104. The core network may also provide access to various internal data networks (e.g., control nodes, routing nodes that transfer information between other terminal devices on radio communication network 100, etc.) and external data networks (e.g., data networks providing voice, text, multimedia (audio, video, image), and other Internet and application data). In an exemplary short-range context, the radio access network provided by network access nodes 110 and 120 may provide access to internal data networks (e.g., for transferring data between terminal devices connected to radio communication network 100) and external data networks (e.g., data networks providing voice, text, multimedia (audio, video, image), and other Internet and application data).

The radio access network and core network (if applicable) of radio communication network 100 may be governed by communication protocols that can vary depending on the specifics of radio communication network 100. Such communication protocols may define the scheduling, formatting, and routing of both user and control data traffic through radio communication network 100, which includes the transmission and reception of such data through both the radio access and core network domains of radio communication network 100. Terminal devices 102 and 104 and network access nodes 110 and 120 may therefore follow the defined communication protocols to transmit and receive data over the radio access network of radio communication network 100. The core network may follow the defined communication protocols to route data within and outside of the core network. Exemplary communication protocols include LTE, UMTS, GSM, WiMAX, Bluetooth, WiFi, mmWave, etc., any of which may be applicable to radio communication network 100.

FIG. 2 shows an internal configuration of terminal device 102 according to some aspects. As shown in FIG. 2, terminal device 102 may include antenna system 202, radio frequency (RF) transceiver 204, baseband modem 206 (including digital signal processor 208 and protocol controller 210), application processor 212, and memory 214. Although not explicitly shown in FIG. 2, in some aspects terminal device 102 may include one or more additional hardware and/or software components, such as processors/microprocessors, controllers/microcontrollers, other specialty or generic hardware/processors/circuits, peripheral device(s), memory, power supply, external device interface(s), subscriber identity module(s) (SIMs), user input/output devices (display(s), keypad(s), touchscreen(s), speaker(s), external button(s), camera(s), microphone(s), etc.), or other related components.

Terminal device 102 may transmit and receive radio signals on one or more radio access networks. Baseband modem 206 may direct this communication functionality of terminal device 102 according to the communication protocols associated with each radio access network. Baseband modem 206 may thus control antenna system 202 and RF transceiver 204 to transmit and receive radio signals according to the formatting and scheduling parameters for the communication protocols. In some aspects where terminal device 102 is configured to operate on multiple radio communication technologies, terminal device 102 may include separate communication components for each supported radio communication technology (e.g., a separate antenna, RF transceiver, digital signal processor, and controller).

Terminal device 102 may transmit and receive wireless signals with antenna system 202, which may be a single antenna or an antenna array that includes multiple antennas. In some aspects, antenna system 202 may additionally include analog antenna combination and/or beamforming circuitry. In the receive (RX) path, RF transceiver 204 may receive analog radio frequency signals from antenna system 202 and perform analog and digital RF front-end processing on the analog radio frequency signals to produce digital baseband samples (e.g., In-Phase/Quadrature (IQ) samples) for baseband modem 206. RF transceiver 204 may include analog and digital reception components including amplifiers (e.g., Low Noise Amplifiers (LNAs)), filters, RF demodulators (e.g., RF IQ demodulators)), and analog-to-digital converters (ADCs), with which RF transceiver 204 may convert the received radio frequency signals to digital baseband samples. In the transmit (TX) path, RF transceiver 204 may receive digital baseband samples from baseband modem 206 and perform analog and digital RF front-end processing on the digital baseband samples to produce analog radio frequency signals for antenna system 202 to wirelessly transmit. RF transceiver 204 may include a Radio Frequency Digital to Analog Converter (RFDAC) to produce the analog radio frequency signals for wireless transmission as described in further detail below. Alternatively, RF transceiver 204 may include analog and digital transmission components including amplifiers (e.g., Power Amplifiers (PAs), filters, RF modulators (e.g., RF IQ modulators), and digital-to-analog converters (DACs), which RF transceiver 204 may utilize to mix the digital baseband samples received from baseband modem 206 and produce the analog radio frequency signals for wireless transmission by antenna system 202. In some aspects baseband modem 206 may control the radio transmission and reception of RF transceiver 204. This may include specifying the radio frequencies RF transceiver 204 to transmit or receive on.

As shown in FIG. 2, baseband modem 206 may include digital signal processor 208, which may perform physical layer (PHY; Layer 1) transmission and reception processing. In the transmit path, digital signal processor 208 may prepare outgoing transmit data (from protocol controller 210) for transmission via RF transceiver 204. In the receive path, digital signal processor 208 may prepare incoming received data (from RF transceiver 204) for processing by protocol controller 210. Digital signal processor 208 may be configured to perform one or more of error detection, forward error correction encoding/decoding, channel coding and interleaving, channel modulation/demodulation, physical channel mapping, radio measurement and search, frequency and time synchronization, antenna diversity processing, power control and weighting, rate matching/dematching, retransmission processing, interference cancelation, and any other physical layer processing functions. Digital signal processor 208 may be structurally realized as hardware components (e.g., as one or more digitally-configured hardware circuits or FPGAs), software-defined components (e.g., one or more processors configured to execute program code defining arithmetic, control, and I/O instructions (e.g., software and/or firmware) stored in a non-transitory computer-readable storage medium), or as a combination of hardware and software components. In some aspects, digital signal processor 208 may include one or more processors configured to retrieve and execute program code that defines control and processing logic for physical layer processing operations. In some aspects, digital signal processor 208 may execute processing functions with software via the execution of executable instructions. In some aspects, digital signal processor 208 may include one or more dedicated hardware circuits (e.g., ASICs, FPGAs, and other hardware) that are digitally configured to specific execute processing functions. The one or more processors of digital signal processor 208 may offload certain processing tasks to these dedicated hardware circuits, which are known as hardware accelerators. Exemplary hardware accelerators can include Fast Fourier Transform (FFT) circuits and encoder/decoder circuits. In some aspects, the processor and hardware accelerator components of digital signal processor 208 may be realized as a coupled integrated circuit.

Terminal device 102 may be configured to operate according to one or more radio communication technologies. Digital signal processor 208 may be responsible for lower-layer processing functions (e.g., Layer 1/PHY) of the radio communication technologies, while protocol controller 210 may be responsible for upper-layer protocol stack functions (e.g., Data Link Layer/Layer 2 and/or Network Layer/Layer 3). Protocol controller 210 may thus be responsible for controlling the radio communication components of terminal device 102 (antenna system 202, RF transceiver 204, and digital signal processor 208) according to the communication protocols of each supported radio communication technology. In some aspects, protocol controller 210 may represent the Access Stratum and Non-Access Stratum (NAS) (also encompassing Layer 2 and Layer 3) of each supported radio communication technology. Protocol controller 210 may be structurally embodied as a protocol processor configured to execute protocol stack software (retrieved from a controller memory) and subsequently control the radio communication components of terminal device 102 to transmit and receive communication signals according to the protocol stack control logic in the protocol software. Protocol controller 210 may include one or more processors configured to retrieve and execute program code that defines the upper-layer protocol stack logic for one or more radio communication technologies, which can include Data Link Layer/Layer 2 and Network Layer/Layer 3 functions. Protocol controller 210 may be configured to perform both user-plane and control-plane functions to transfer application layer data to and from radio terminal device 102 with the specific protocols of the supported radio communication technology.

User-plane functions can include header compression and encapsulation, security, error checking and correction, channel multiplexing, scheduling and priority, while control-plane functions may include setup and maintenance of radio bearers. The program code retrieved and executed by protocol controller 210 may include executable instructions that define the logic of such functions.

Terminal device 102 may also include application processor 212 and memory 214. Application processor 212 may be a CPU configured to handle the layers above the protocol stack, including the transport and application layers. Application processor 212 may be configured to execute various applications and/or programs of terminal device 102 at an application layer of terminal device 102. These applications and/or programs may include an operating system (OS), a user interface (UI) for supporting user interaction with terminal device 102, and/or various user applications. The application processor may interface with baseband modem 206 and act as a source (in the transmit path) and a sink (in the receive path) for user data, such as voice data, audio/video/image data, messaging data, application data, basic Internet/web access data, etc. In the transmit path, protocol controller 210 may receive and process outgoing data provided by application processor 212 according to the layer-specific functions of the protocol stack, and provide the resulting data to digital signal processor 208. Digital signal processor 208 may then perform physical layer processing on the received data to produce digital baseband samples, which digital signal processor may provide to RF transceiver 204. RF transceiver 204 may then process the digital baseband samples to convert the digital baseband samples to analog RF signals, which RF transceiver 204 may wirelessly transmit via antenna system 202. In the receive path, RF transceiver 204 may receive analog RF signals from antenna system 202 and process the analog RF signals to obtain digital baseband samples. RF transceiver 204 may provide the digital baseband samples to digital signal processor 208, which may perform physical layer processing on the digital baseband samples. Digital signal processor 208 may then provide the resulting data to protocol controller 210, which may process the resulting data according to the layer-specific functions of the protocol stack and provide the resulting incoming data to application processor 212. Application processor 212 may then handle the incoming data at the application layer, which can include execution of one or more application programs with the data and/or presentation of the data to a user via a user interface.

Memory 214 may embody a memory component of terminal device 102, such as a hard drive or another such permanent memory device. Although not explicitly depicted in FIG. 2, the various other components of terminal device 102 shown in FIG. 2 may additionally each include integrated permanent and non-permanent memory components, such as for storing software program code, buffering data, etc.

In accordance with some radio communication networks, terminal devices 102 and 104 may execute mobility procedures to connect to, disconnect from, and switch between network access nodes of the radio access network of radio communication network 100. As each network access node of radio communication network 100 may have a respective coverage area, terminal devices 102 and 104 may be configured to select and re-select between the available network access nodes to maintain a strong radio link with the radio access network of radio communication network 100. For example, terminal device 102 may establish a radio link with network access node 110 while terminal device 104 may establish a radio link with network access node 112. In the event that the current radio link degrades, terminal devices 102 or 104 may seek a new radio link with another network access node of radio communication network 100. For example, terminal device 104 may move from the coverage area of network access node 112 into the coverage area of network access node 110. As a result, the radio link with network access node 112 may degrade. Terminal device 104 may detect that degradation with radio measurements such as signal strength or signal quality measurements of network access node 112. Depending on the mobility procedures defined in the appropriate network protocols for radio communication network 100, terminal device 104 may seek a new radio link (which may be, for example, triggered at terminal device 104 or by the radio access network). In some cases, terminal device 104 may search for a new radio link by performing radio measurements on neighboring network access nodes to determine whether any neighboring network access nodes can provide a suitable radio link. As terminal device 104 may have moved into the coverage area of network access node 110, terminal device 104 may identify network access node 110 (which may be selected by terminal device 104 or selected by the radio access network) and transfer to a new radio link with network access node 110. These mobility procedures, including radio measurements, cell selection/reselection, and handover, are defined in the various network protocols.

Figure 3:
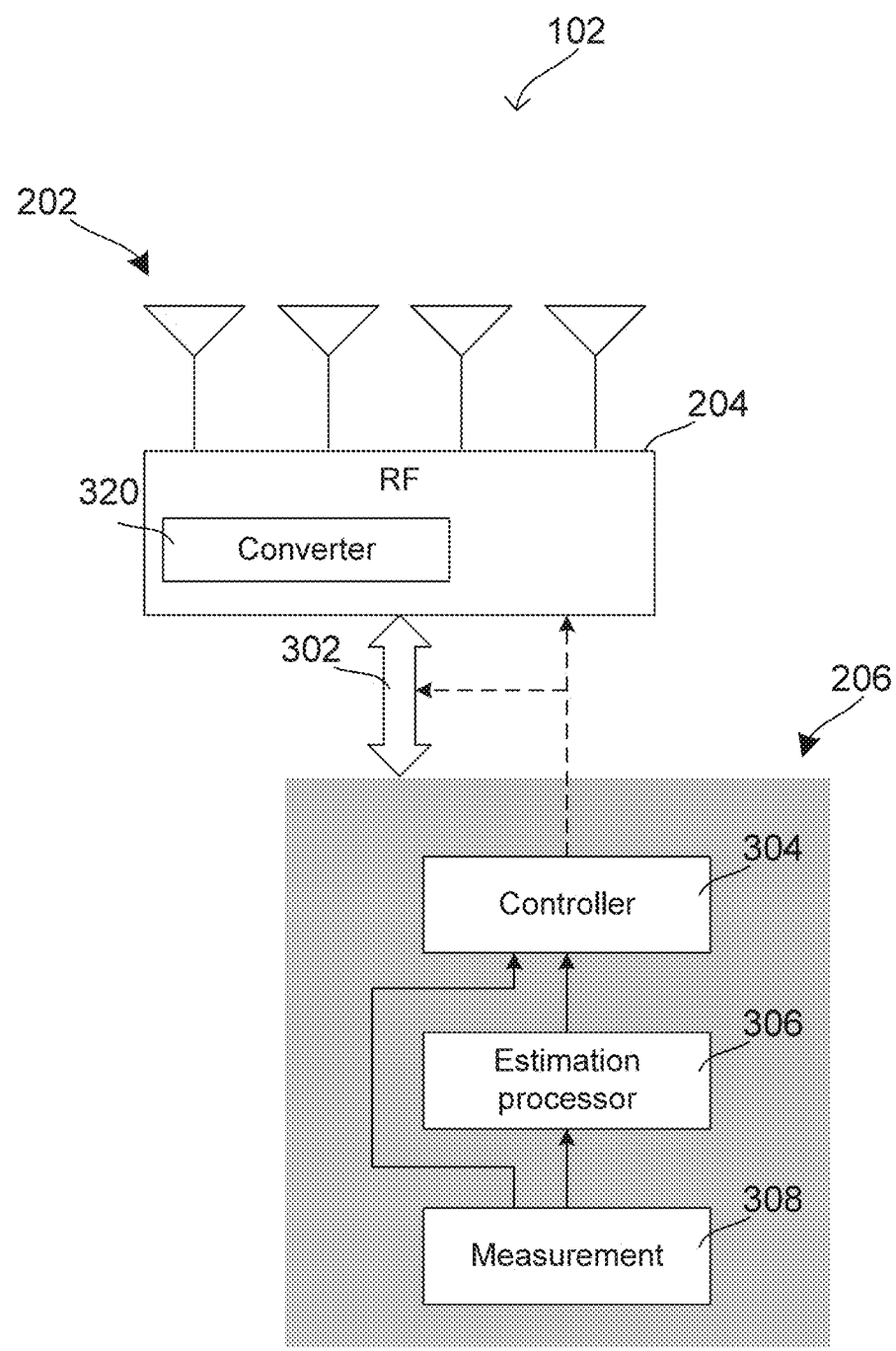
FIG. 3 shows an exemplary internal configuration of a terminal device configured for dynamic resource assignment in carrier aggregation according to some aspects.

FIG. 3 shows an exemplary internal configuration of terminal device 102 according to some aspects. Terminal device 102 may be configured to perform this disclosure's resource assignment technique. As shown in FIG. 2, terminal device 102 may include antenna system 202, RF transceiver 204, and baseband modem 206, which may be configured as described above for FIG. 2. In the example of FIG. 3, antenna system 202 is shown with four antennas. Thus, in the receive direction antenna system 202 may be capable of supporting up to four layers for each carrier. In other examples, the number of antennas, number numRx of antenna data streams for a carrier, and the maximum number of layers is scalable to any quantity.

In the configuration shown in FIG. 3, terminal device 102 may also include data bus 302, controller 304, estimation processor 306, measurement engine 308, and converter 320. Data bus 302 may be set of data lines that interface RF transceiver 204 with baseband modem 206. Data bus 302 may have finite capacity. For example, data bus 302 may only be able to route a maximum amount of data from RF transceiver 204 to baseband modem 206. This may limit the total number of supported data streams from antenna system 202 that RF transceiver 204 can deliver to baseband modem 206. In some aspects, the hardware capabilities of RF transceiver 204 may also limit this total number of supported antenna data streams. For example, the hardware design of RF transceiver 204 (e.g., multiplexers or analog circuitry components) may only be capable of supporting a total number of supported antenna data streams.

As described above for FIG. 2, baseband modem 206 of terminal device 102 may include physical layer subcomponents (DSP 208) and protocol stack subcomponents (protocol processor 210). The subcomponents of baseband modem 206 may be part of those physical layer subcomponents (DSP 208) and/or those protocol stack subcomponents (protocol processor 210); in other words, the subcomponents shown in FIG. 3 are not limited to being physical layer or protocol stack layer components. Controller 304 of baseband modem 206 may be a controller configured to manage carrier aggregation and to assign device processing resources to carriers. In some aspects, controller 304 may be a protocol stack layer component, such as part of protocol processor 210, or may be a physical layer component, such as part of digital signal processor 208. Estimation processor 306 may be a processor configured to determine estimates of the throughput gain and power penalty for various device processing resources. These operations are described below in full for FIG. 4. In some aspects, estimation processor 306 may be a protocol stack layer component, such as part of protocol processor 210, or may be a physical layer component, such as part of digital signal processor 208.

Measurement engine 308 may be circuitry configured to perform channel measurements. In some aspects, measurement engine 308 may include digital hardware circuitry (e.g., an ASIC) configured to process digital data to determine channel measurements. In some aspects, measurement engine 308 may additionally or alternatively include one or more processors configured to execute software that processes digital data to determine channel measurements. In some aspects, measurement engine 308 may be part of baseband modem 206's physical layer, such as part of DSP 208.

Converter 320 may be a Radio Frequency Digital-to-Analog Converter. The RFDAC architecture uses an array of small unit-cell power amplifiers that are conditionally connected in parallel according to a digital code. A line and a column decoder ensures that the correct number of unit-cells are activated and their output power is combined into the matching network.

Figure 4A:
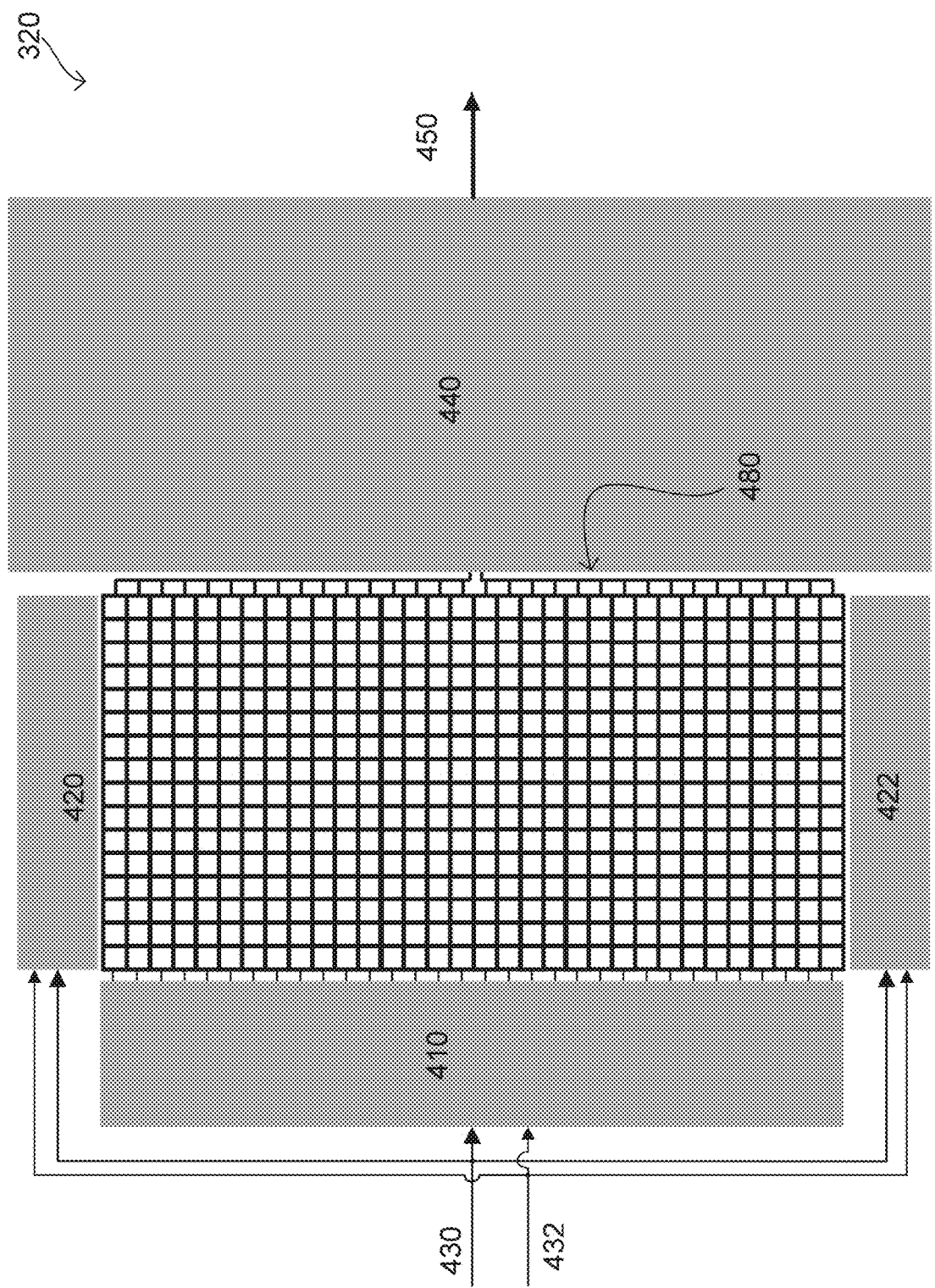
FIGS. 4A-4C show exemplary block diagrams of an RFDAC according to some aspects.

FIG. 4A depicts an exemplary RFDAC. The Radio Frequency Digital-to-Analog Converter (RFDAC) presents itself as an alternative to the usual radio frequency transmit chain, which include digital-to-analog converter, baseband filter, up-converting mixer and power amplifier. As illustrated in 4A, converter 320 may include an array of until-cell power amplifiers 480, a digital decoder 410 sometimes referred to as a column decoder, a first phase component line decoder 420, a second phase component line decoder 422, and a matching network 440. The converter receives digital signal 430 and local oscillator signal 432 and produces radio frequency signal 450. The architecture of converter 320 uses an array of small unit-cell power amplifiers 480 that are conditionally connected in parallel according to a digital code word. The line decoders 420 and 422 along with the digital decoder 410 ensure that the correct number of unit-cells amplifiers of array 480 are activated and that their output power is combined into the matching network 440.

For example, column decoder 410 outputs a clock where the phase is dependent on an input code and a sign. Additionally decoder 410 outputs an enablement signal to enable unit-cells of array 480, wherein the enablement signal is al dependent on the input code and the sign.

An exemplary array 480 may make of use of differential unit-cells. A differential unit-cell is configured to receive a clock component and a 180 degree clock. Additionally, a further enabling signal for the column of unit-cells may be implemented to activate the unit-cells.

Figure 4B:
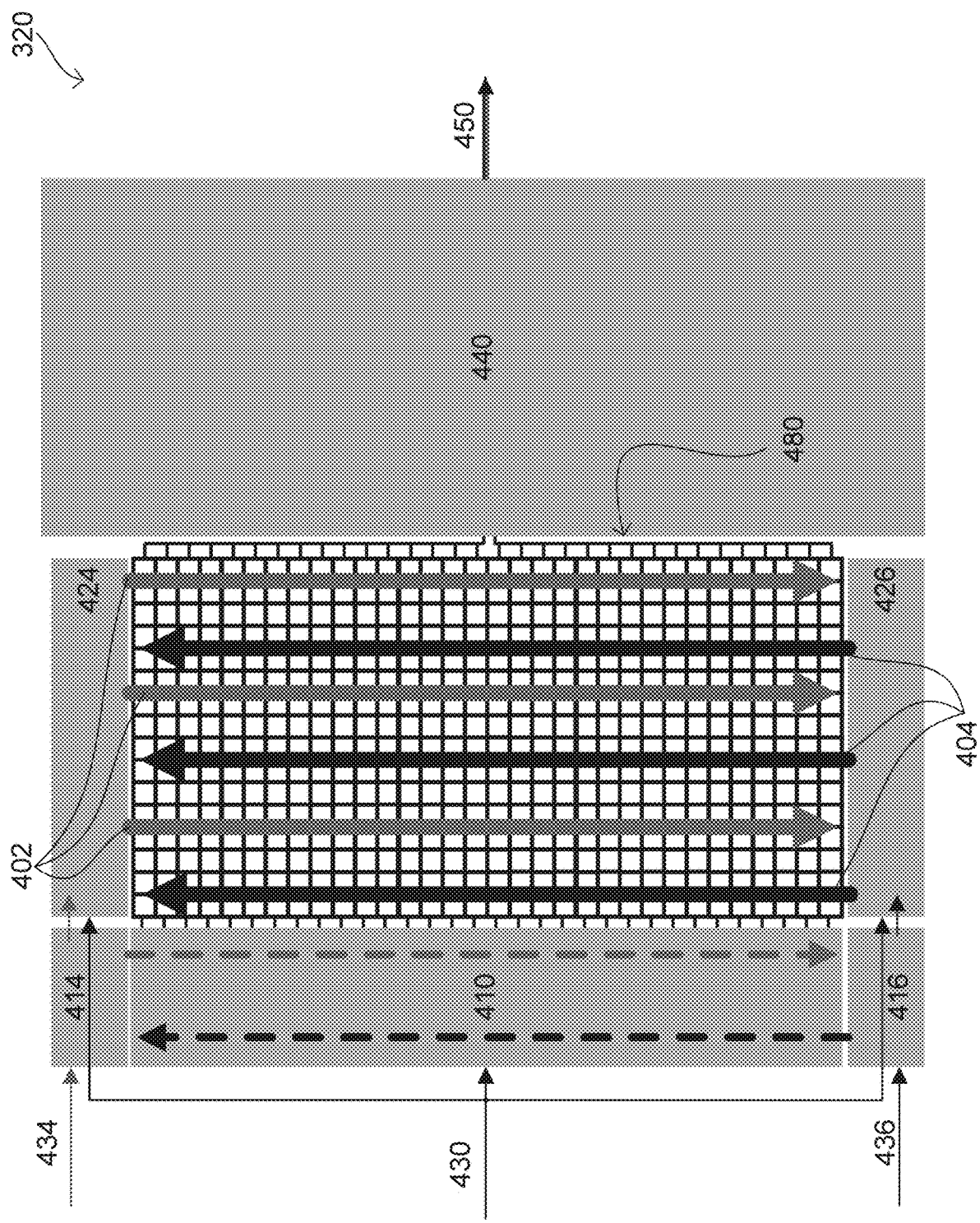

FIG. 4B depicts converter 320 as an exemplary I/Q RFDAC. It should be noted that this configuration is also applicable to a multi-phase RFDAC. As illustrated in 4A, converter 320 may further include a first phase component local oscillator buffer 414, a second phase component local oscillator buffer 416, which receive first phase component local oscillator signal 434, a second phase component local oscillator signal 436 respectively. Additionally, first phase component line decoder 420 and second phase component line decoder 422 determine whether or not to activate a unit-cell power amplifier of array 480 as depicted by arrows 402 and 404 respectively. It should be noted that second phase component line decoder 422 and second phase component local oscillator buffer 416 would not be required in a Polar RFDAC configuration.

The topologies for an RFDAC can be subdivided into two categories. The first is polar, where the amount of active power amplifier unit-cells determine the amplitude and the phase is defined by the local oscillator. The second is I/Q Cartesian, where the vector addition of orthogonal components for in-phase (I) and in-quadrature (Q) determine amplitude and phase. Due to the performed vector addition, for the same number of cells the IQ-RFDACs can provide less output power for I/Q Cartesian topology as compared to Polar topology. However, polar RFDACs have the disadvantage that the amplitude and phase spectrum requires bandwidths larger than the baseband signal, thus its application is usually limited to narrowband signals. Broadband modern Long Term Evolution (LTE) and New Radio (NR) transmitters are more likely to apply the IQ-RFDACs topology.

As depicted in FIG. 4B the I/Q RFDAC's unit-cell amplifiers in the array 480 are provided with the capability of operate in either the first phase component, for example the I clock component, or the second phase component, for example the Q clock component. Therefore, as illustrated in FIG. 4B both clock components may be distributed to all columns. The column decoder 410 decides based on the I/Q input digital code 430 if each individual row of array 480 will receive an I clock component or a Q clock component or if its clock should be deactivated. Line decoders 424 and 426 in turn decide if unit-cell amplifiers of array 480 in row active by a column slice shall be activated or deactivated. Consequently, each line control signal must be routed through the every unit-cell amplifier in a row of array 480, as illustrated by the arrows 402 and 404.

This implementation requires a challenging decoding procedure inside the digital decoder 410. In order to reach all rows of array 480 and to perform the conversion from binary to thermometric code, the control signals must cover a large physical distance in the layout. Because of this, internal logic gates of decoder 410 shall have very large fan-out in order to distribute signals required in the decision of the clocks' activation and polarity in every row of array 480. Furthermore, the digital code of both I and Q clock components must be involved in each decoding and activation procedure, thus increasing the complexity and the combinational logic depth. The ever-growing operational frequencies of RFDACs imposes very limited propagation times to the signals. This comes at the cost of additional current and silicon die area.

A second drawback of this solution presents itself in the LO buffers 414 and 416 and the output stages of the line decoders 424 and 426 which require a large fan-out to reach all the unit-cell amplifiers. As indicated by arrows 402 and 404, the line decoders 424 and 426 must drive cells for the entire array 480. Once again, this introduces two drawbacks. The first, that this requires a large fan out of lines. The second, a large physical distance that needs to be covered, introducing significant parasitic. Consequently, the output gates must be very large to be able to drive the large loads and leads to large power consumption.

Furthermore, in most applications the unit-cell power amplifier array 480 shall have a separate supply domain. This is done in order to optimize the supply voltage depending on the output power requirement. In this case, switching of the line control signals from line decoders 424 and 426, injects charge across the supply domains resulting in crosstalk which elevates the spectrum noise level. The higher the load presented to output stages of the line decoders 424 and 426, the larger the charge injection.

Figure 4C:
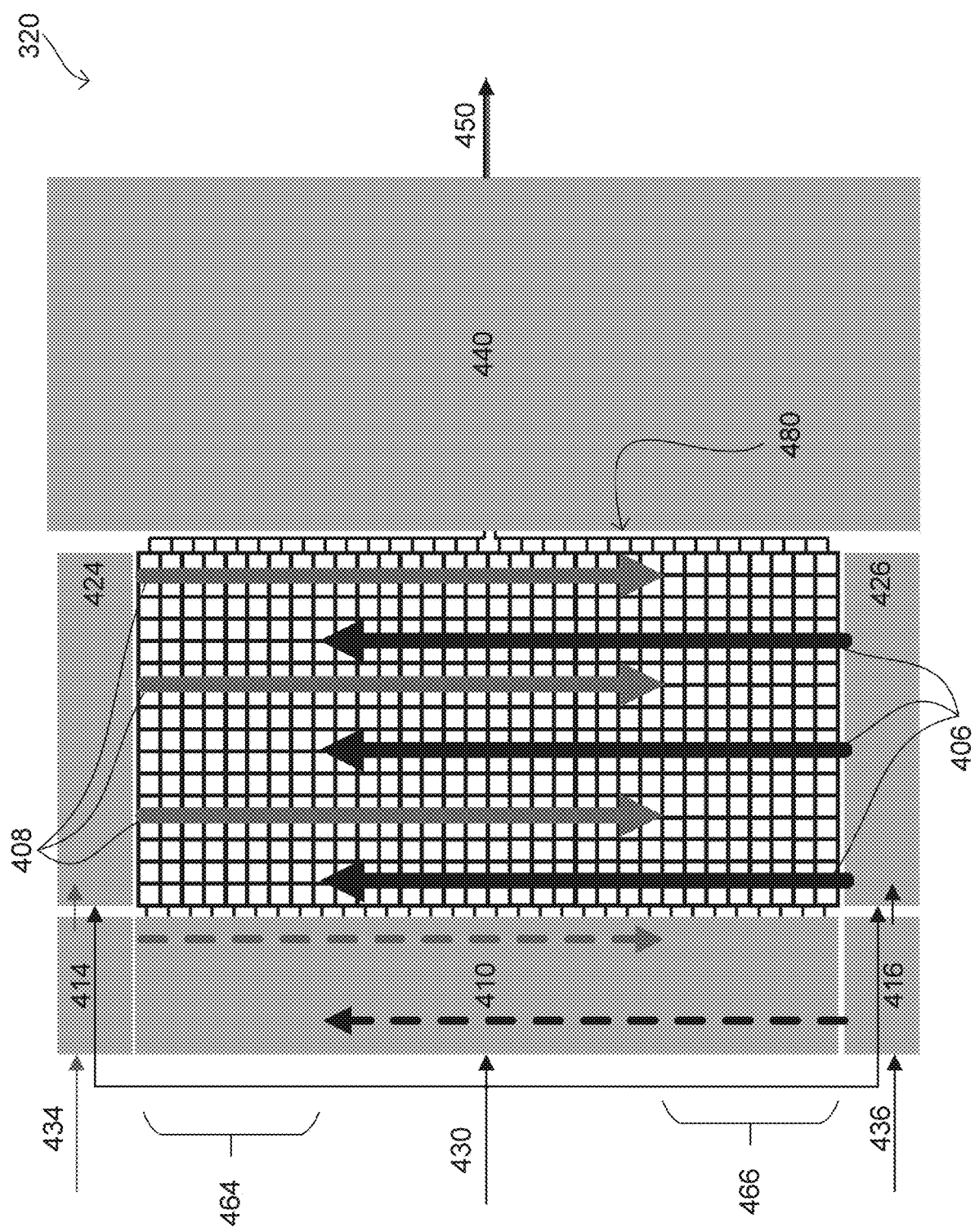

FIG. 4C depicts an exemplary RFDAC which reduces the individual unit-cell amplifiers that need to be activated by multiple clock components. In various aspects, the reduction of coverage for the unit-cell power amplifier array 480 within the Radio Frequency Digital to Analog Converter (RFDAC) 320 is described. By reducing the amount of unit-cell power amplifiers that each block component covers, power consumption is reduced. Additionally, logic gates can be simplified and these modifications do not result in any drawback to signal quality.

For example, in the case of an IQ-RFDAC, if only $(1/\sqrt{2})\times100\%$ of the unit-cell power amplifiers of array 480 would be available for each component of a two phase clock, power consumption could be reduced without affecting output signal quality. By reducing the amount of power amplifiers available to each phase component, the line control signals distributed by line decoders 424 and 426, the buffered logical oscillator (LO) signal, and the decoding signal do not need to reach every unit-cell power amplifier of the array 480.

As another example, in the case of a multiphase-RFDAC, if only $\cos(\Delta\Phi/2)\times100\%$ of the unit-cell power amplifiers of array 480 would be available for each component of a multi-phase clock, power consumption could be reduced without affecting output signal quality. By reducing the amount of power amplifiers available to each phase component, the line control signals distributed by line decoders 424 and 426, the logical oscillator (LO) buffer signal, and the decoding signal do not need to reach every unit-cell power amplifier of the array 480.

The reduction of the reach required results in lower power consumption which is directly proportional to the driven capacitance, thus reducing the fan-out and driven lines size. For example, line decoders 424 and 426 may only have to distribute line control signals to a portion of the rows of array 480 as depicted by arrows 408 and 406. Given that the output buffers are in the LO buffers 414 and 416 contribute to line decoders 424 and 426 power consumption, reducing their power consumption corresponds to a significant part of RFDAC 320 total power consumption. The logic simplification at decoder 410 will reduce the propagation time, enabling for higher frequencies of operation. As a side effect, the charge injected across power domains is reduced, potentially leading to lower cross-talk and noise. The simplified logic with decoder 410 also allows more compact layouts with consequent silicon area reduction.

Some aspects of a reduced unit-cell power amplifier array 480 utilization scheme may also allow for easy implementation of a low power mode of operation. Therefore, making some LO and line control routing resources unnecessary and can instead be used to route separate LO and line control signals in cases of limited output power.

In a 90 degree phase difference between clock components, such as an IQ-RFDAC, one could reduce the coverage of cells in array 480 to only require $(1/\sqrt{2})\times100\%$ of the unit-cell power amplifiers for each component. For example, region 464 of array 480 is only concerned with the first clock component and region 466 of array 480 is only concerned with the second clock component. The rest of array 480 is can be activated as either the first clock component or the second clock component. For example, as both I or Q in the case of an IQ RFDAC. Depending on the implemented number of rows and columns in array 480, one can get very close to the value of $(1/\sqrt{2})\times100\%$. For example, if array 480 is divided into four sections, regions 464 and 466 could both be 25% of array 480 and only be activated as the first clock component or the second clock component respectively, leaving the other 50% of array 480 to be activated as either the first clock component or the second clock component. This ensures that at least $(1/\sqrt{2})\times100\%$ of the unit cell power amplifiers are able to be activated for each of the clock components. For example, in an IQ RFDAC 25% of an array would be able to be activated as the I component exclusively, 25% of an array would be able to be activated as the Q component exclusively. In this case, and 50% of an array would be able to be activated as both the I and Q components. This would allow for 75% of an array to operate as either of the I or Q clock components. Not all unit-cell power amplifiers are capable of operating as both components. Part of the array is exclusively for the I clock component or the Q clock component as depicted in FIG. 4C. Consequently, the line control signals 406 and 408, the buffered LO signals inside of the decoder 410, and the decoding signals from the digital code 430 must reach solely approximately $(1/\sqrt{2})\times100\%$ of its current range of array 480. It is proved that for normal LTE and NR signals, this modification does not imply any drawback in signal quality or otherwise and enables massive logic reduction and simplifications.

It should be noted that in multiphase RFDACs, $\cos(\Delta\Phi/2)\times100\%$ coverage of unit-cells for each component may be required.

The unit-cells array utilization as illustrated in FIG. 4C. uses a reduced coverage range of unit-cells for each signal phase component. For example I components or Q components in an IQ RFDAC. As an illustration, a number dividable by 4 is chosen, thus 75% coverage is chosen because it is the nearest integer to and bigger than the value of $(1/\sqrt{2})\times100\%$ coverage. Therefore, 25% of the unit-cells at the bottom are reserved exclusively for the second clock component, I-component for example, and the 25% at the top exclusively for the first clock component, Q-component for example. Thus, the line control signals and the buffered LO must reach only 75% of the array, providing lower fan-out, shorter physical lines and simpler combinational logic.

Figure 6A:
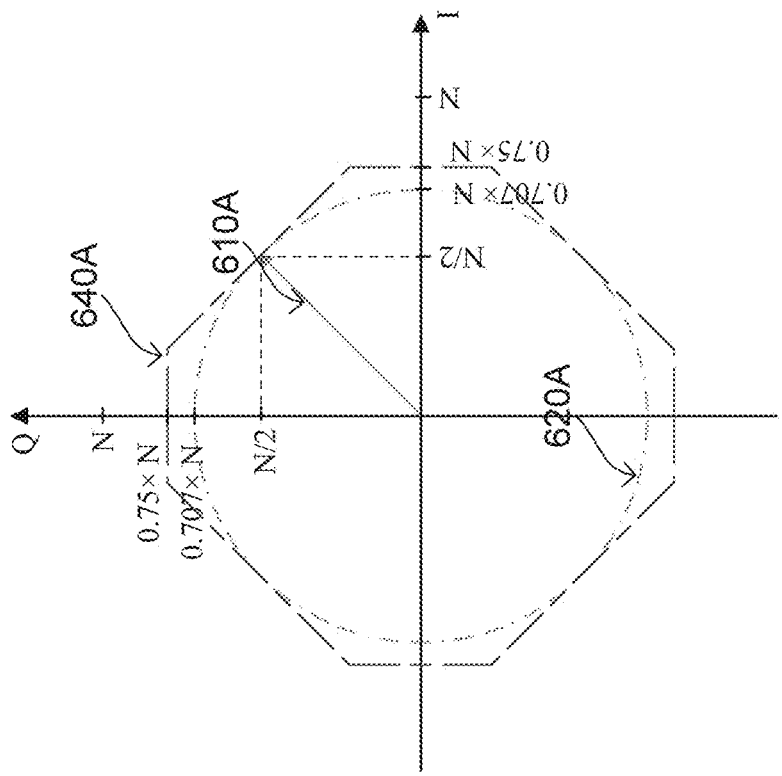
FIGS. 6A-6B show exemplary implementable values of an RFDAC according to some aspects.
Figure 6A:
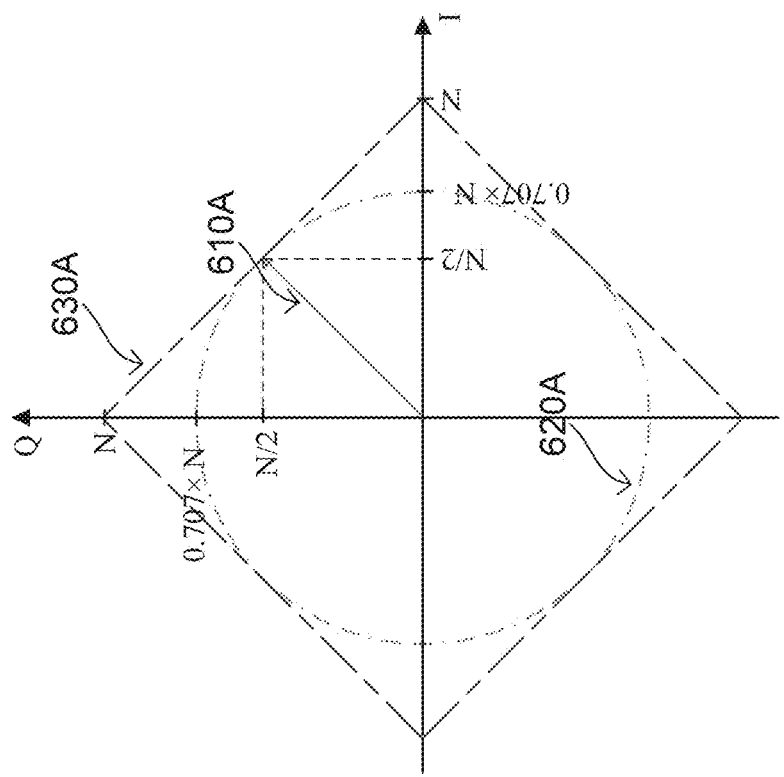

FIG. 6A depicts originally implementable values displayed as 630A. This modification translates in a reduced constellation of implementable values displayed as line 640A for a two phase clock such. Notice that the implementable value suffices to cover the circle of values limited by the maximum output power implementable for all signal phases.

Figure 5A:
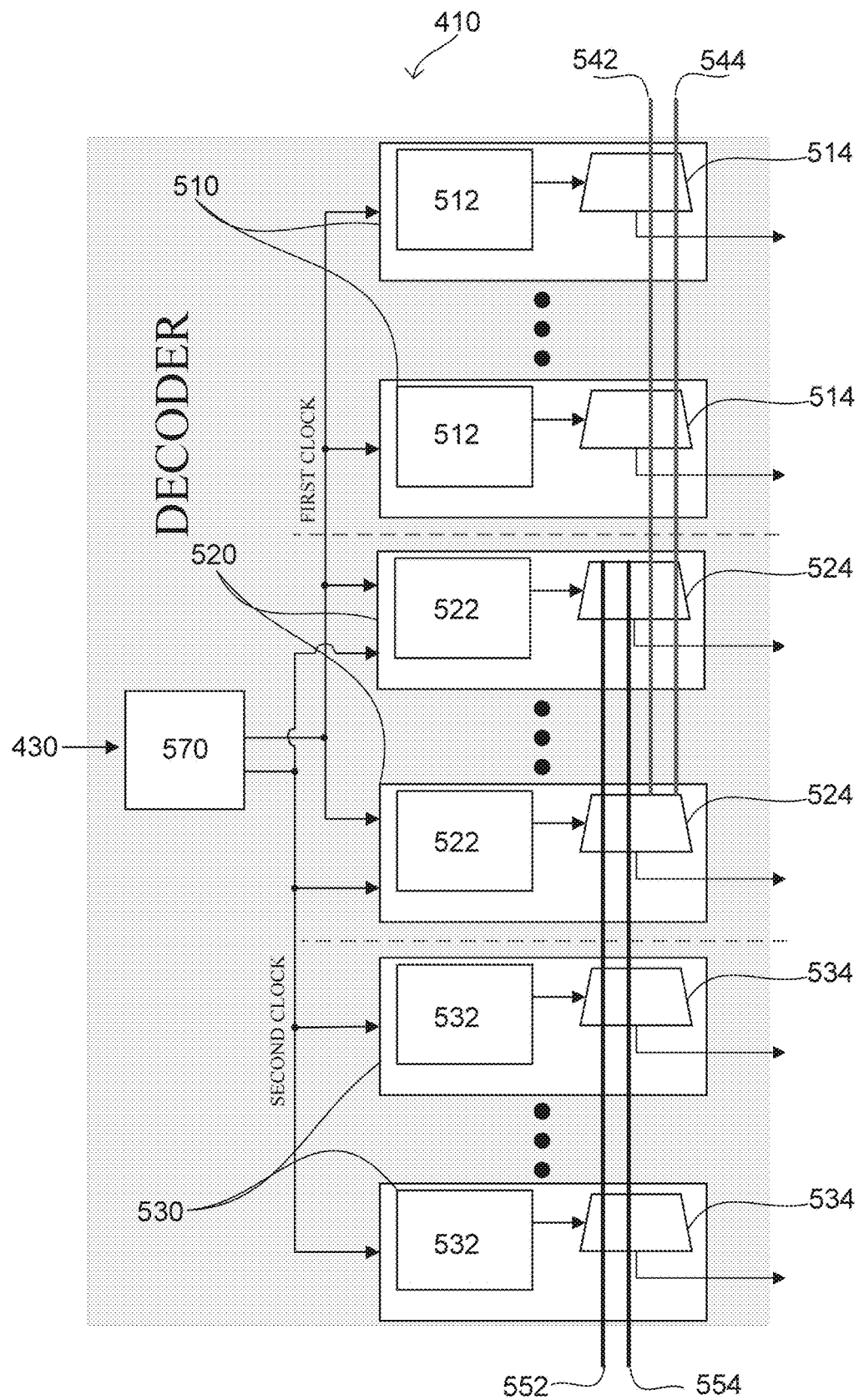
FIGS. 5A-5C show exemplary block diagrams of a decoder according to some aspects.

FIG. 5A depicts an exemplary decoder 410 in further detail. As described above with regard to FIGS. 4A-4C, the decoder 410 controls activation of the rows of array 480 according to different clock components. FIG. 5A depicts an exemplary decoder for decoding a two phase clock, such as an IQ clock. Decoder 410 receives digital signal 430 through interface registers 570. Interface registers 570 distribute the digital signal for the first component to column slices 510 and clock column slices 520. Interface registers 570 distribute digital signal for the second component to clock column slices 520 and column slices 530. Clock component slices 520 receive both clock components while component slices 510 and 530 receive only the first clock component and only the second clock component respectively.

Clock component slices 510, 520, and 530 may include combinational logic 512, 522, and 532 respectively and multiplexers (MUX) 514, 524, and 534 respectively. Additionally, component slices receive the clocks 542, 544, 552, and 554 from LO oscillator buffers 414 and 416 (found in FIG. 4B).

Column slices 510, 520, and 530, maybe configured to output enabling signals and clocks for each row in array 480. Despite the name "column" each slice controls a row as depicted in FIGS. 4A-4C. For example, if array 480 is a 32 by 16 array it would have 32 column slices to control each of the 32 rows in array 480. An exemplary RFDAC may implemented where the line decoders control the columns as shown in FIGS. 4A-4C or rows (not depicted). Likely, the column slices maybe configured to control the rows as shown in FIGS. 4A-4C or columns (not depicted). The term column is a matter of perspective and should not be interpreted as limiting.

An exemplary column decoder may comprise column slices 510, 520, and 530 which may be configured to output four enabling signals and two clock signals in the case of a differential clock. Depending on the combination of the enabling signal of the columns slices and the line control signal of line decoders 424 and 426 a unit-cell is enabled or not. If a unit-cell is enabled, it will output in phase with the clock received through the column slice. The clock output is defined by a LO multiplexers 514, 524, and 534. It is important to note that the column decoder outputs one clock where the phase is dependent on the input code and sign, and select signals to enable the unit-cells (also dependent on the input code and sign).

Combination logic 512 and 532 are configured to threat sign change and a clock component. For example, combination logic 512 is configured for sign change and a first clock component and combination logic 532 is configured for sign change and a second clock component. While, combination logic 522 is configured to threat first clock component and second clock component.

LO multiplexers (MUX) 514, 524, and 534 receive input from combination logic 512, 522, and 532 respectively. Unit-cells of array 480 are activated by an enablement signal that the unit cells receive from LO multiplexers (MUX) 514, 524, and 534 and from a line control signal represented by arrows 402 and 404 received from line decoders 424 and 426. If a column of unite cells is active, it receives the correct clock according to output from LO MUX 514, 524, and 534.

Sign 542 represents a positive sign for the first clock component, 544 represents a negative sign for the first clock component, 552 represents a positive sign for the second clock component, and 554 represents a negative sign for the second clock component.

MUX 514 and 524 receive the clock sign for the first clock component and MUX 524 and 534 receive the clock sign for the second clock component.

As an example of an IQ-RFDAC supporting sign change, as shown in FIG. 5A, rows of array 480 which support activation of both the first clock component and the second clock component (those activated by component slices 520) must not support sign change. Rows of array 480 which support activation of the first clock component only (those activated by component slices 510) and the second clock component only (those activated by component slices 530) must only support sign change.

For example, in an IQ-RFDAC, component slices 510 would only be concerned with the I phase clock component, component slices 520 would be concerned with both the I phase clock component and the Q phase clock component, and component slices 530 would only be concerned with the Q phase clock component. To achieve the $(1/\sqrt{2}) \times 100\%$ coverage described above, component slices 510 may cover 25% of the rows in array 480, component slices 520 may cover 50% of the rows in array 480, and component slices 530 may cover 25% of the rows in array 480. Due to the synchronization of the activation control signals with the LOs, sign changes are usually challenging in IQ-RFDACs. The proper sign change logic implementation requires relatively complex logic. By not having to simultaneously deal with sign change and two clock components of the digital signal, the logic may be simplified, which in turn is favourable for higher operation frequency. Indeed, for much larger relative bandwidth some component slices will need to support sign changes as well as both signal components.

Figures 8A, 8B:
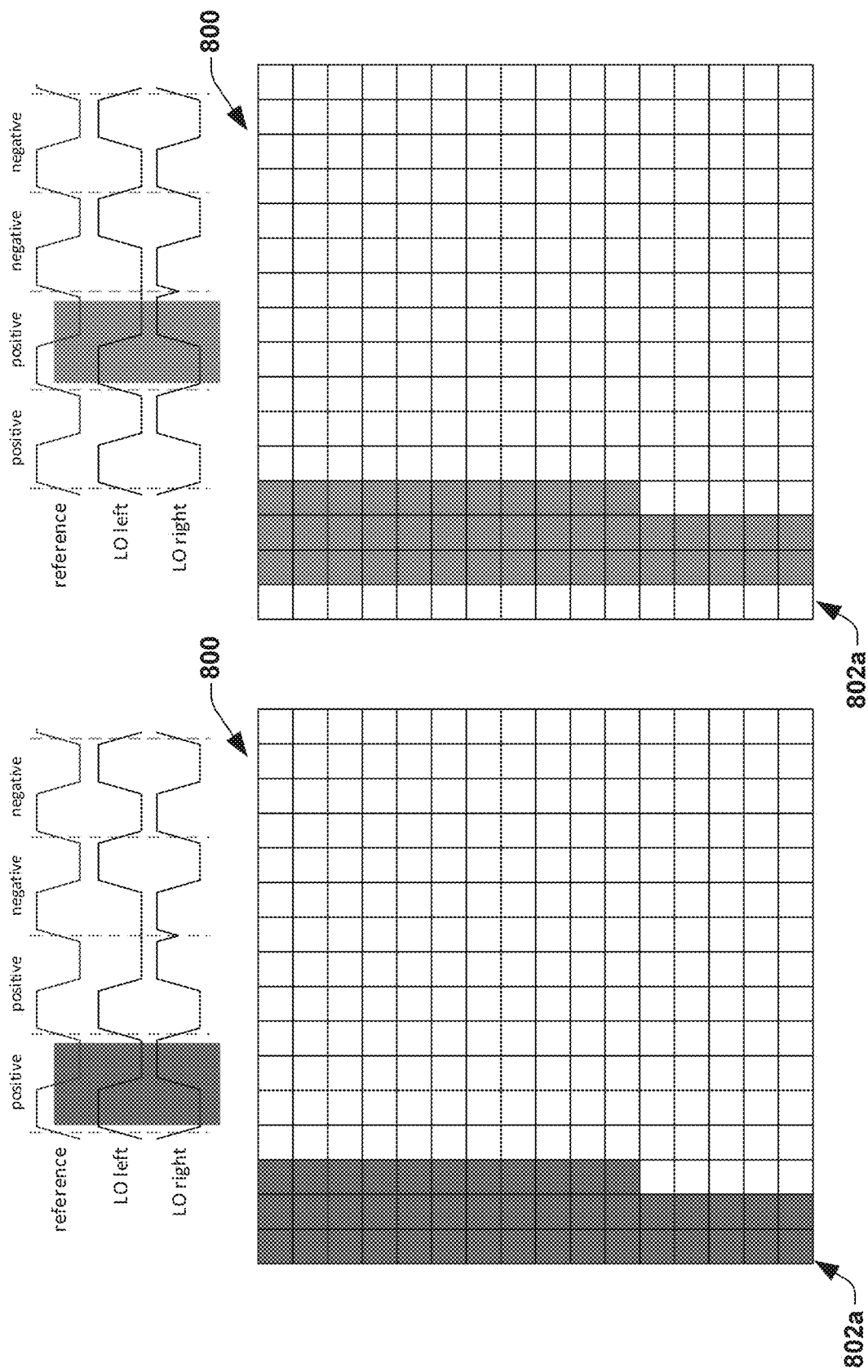
FIGS. 8A-8D show exemplary sign switching in an IQ RFDAC according to some aspects.
Figure 8D:
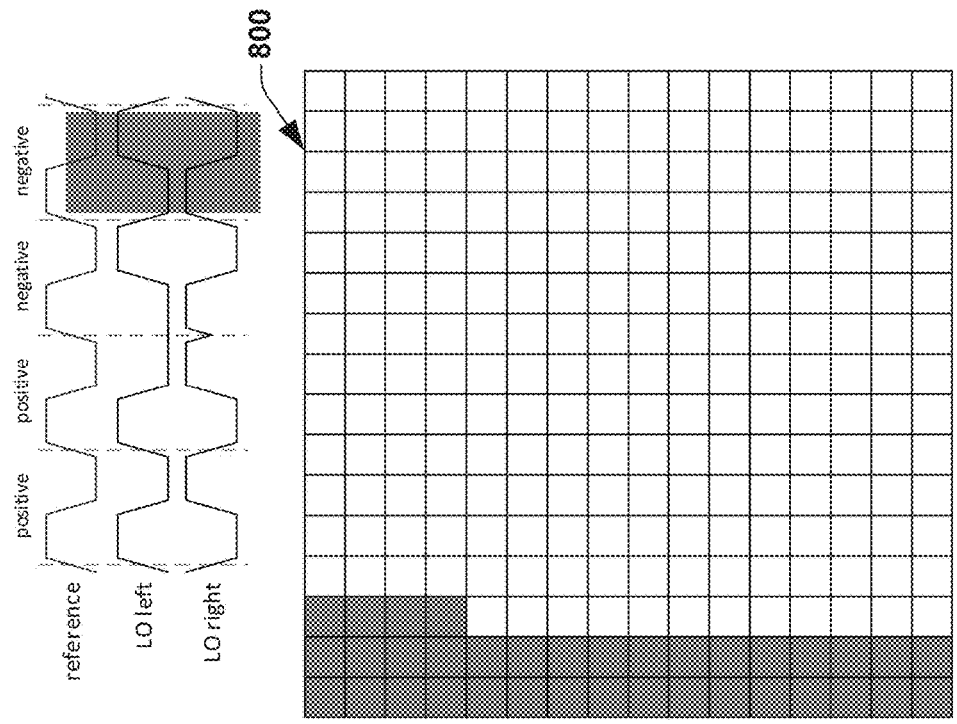
Figure 8C:
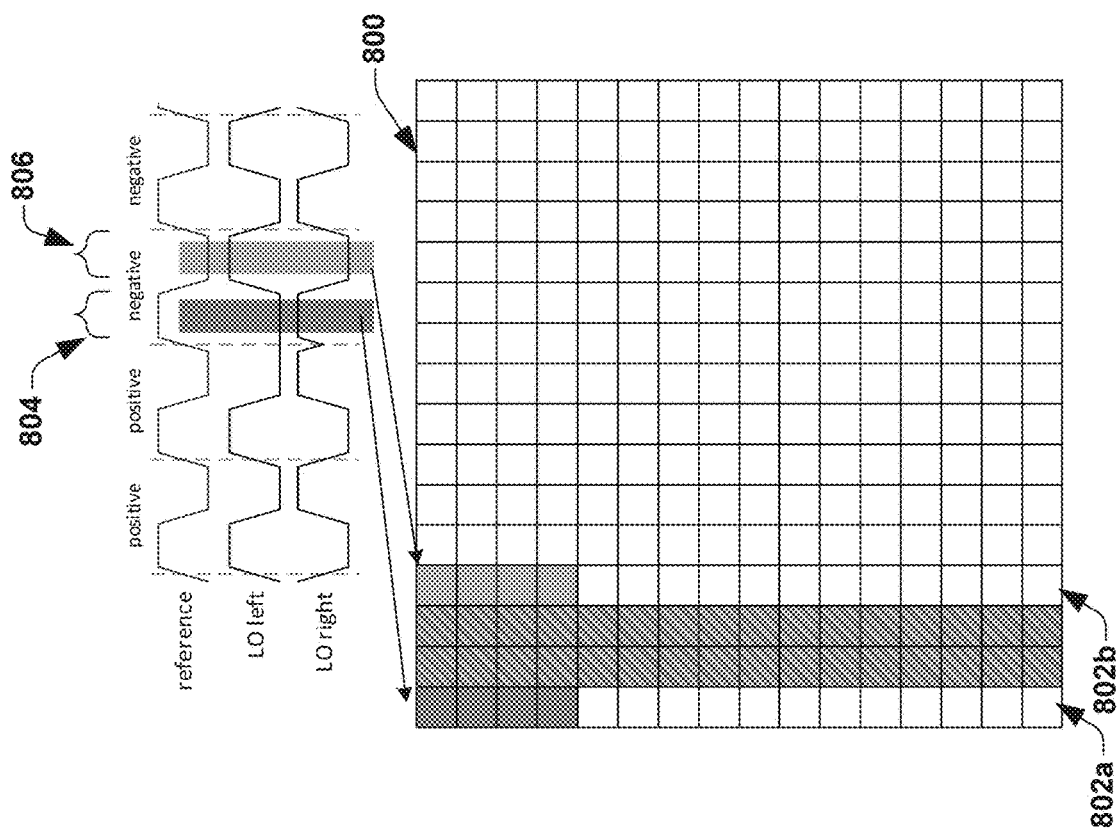

Sign switching may be handled in many ways. As an example, in an IQ RFDAC sign switching is associated with I-phase input data in the RFDAC array circuit. In some aspects, the I-phase segments are filled from left to right, during regular operation, as shown in FIG. 8A. In this case the left most I-phase segment 802a (unit-cell power amplifier activated according to the I phase component) of array 480 is utilized as the I-phase sign change segment. However, in other aspects, the I-phase sign change segment may include any unit-cell power amplifier within the array of the RFDAC that is different from the set of I-phase segments and the set of Q-phase segments. In order to utilize the left most segment 802a as the I-phase sign change segment, the RFDAC array circuit 800 is configured to shift, during an LO period prior to the sign change, the set of I-phase segments in such a way that the left most segment 802a is empty prior to the sign change as shown in FIG. 8B. Further, during a first half of the LO period after the sign change 804, the partially active segment 802b is deactivated and the I-phase sign change segment 802a is activated to handle the sign change. Further, in the second half of the LO period after the sign change 806, the I-phase sign change segment 802a is deactivated and the partially active segment 802b is reactivated, as shown in FIG. 8C. Furthermore, after the subsequent LO period after the sign change, the set of I-phase segments are shifted back to the original position, as shown in FIG. 8D. The above implementation is only one possible implementation and is not to be construed to be limiting. In other aspects, the sign switching may be implemented without shifting the set of I-phase segments, based on utilizing any available segment (I-phase or Q-phase) to handle the sign change.

Figure 5B:
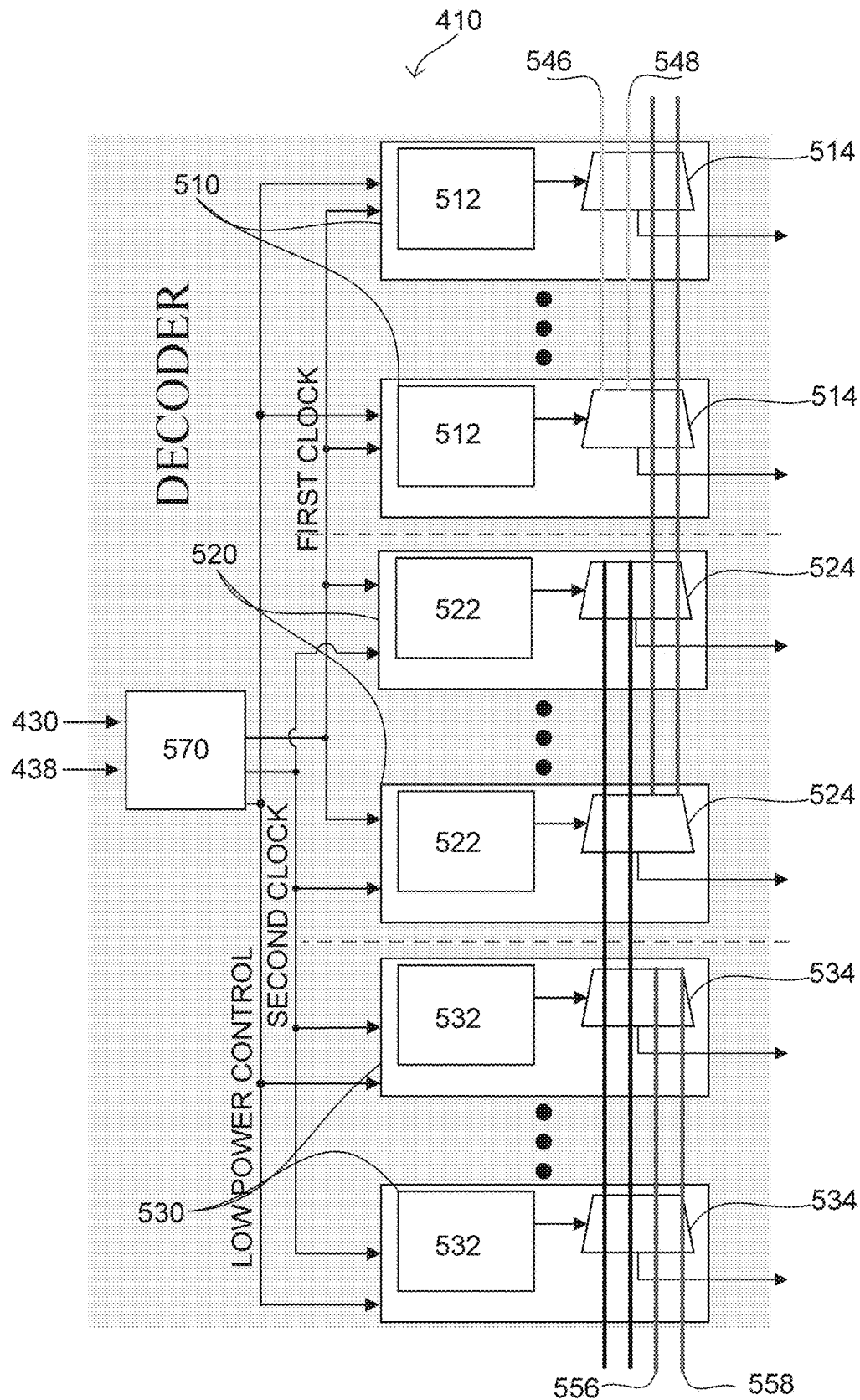

FIG. 5B depicts an exemplary decoder that extends the benefits introduced with respect to FIG. 5A by allowing to incorporate a low power control signal. low power control signal 438 is received by interface registers 570. Additionally, component slices receive the signal signs 542, 544, 552, and 554 may be reserved for high power only. Signal signs 546, 548, 556, and 558 from LO oscillator buffers 414 and 416 may be reserved or low power signal signs only.

For example, signal sign 542 represents a high power positive sign for the first clock component, 544 represents a high power negative sign for the first clock component, 552 represents a high power positive sign for the second clock component, and 554 represents a high power negative sign for the second clock component.

Additionally, signal sign 546 represents a low power positive sign for the first clock component, 548 represents a low power negative sign for the first clock component, 556 represents a low power positive sign for the second clock component, and 558 represents a low power negative sign for the second clock component. As depicted, the low power signal sign must only be routed to component slices concerned with sign change, i.e. 512 for the first clock component and 532 for the second clock component.

For example, an IQ RFDAC may implemented as depicted in FIG. 5B. This extends the benefits of the unit-cells array utilization described in FIG. 4C. In this way, one can use the area and metals previously used for routing both clock components for their respective local oscillators to implement a dedicated low power oscillator signal. Said differently area and metals previously used to route a component signal of a first clock component from the local oscillator for the first clock to a component slice dedicated to the second clock component may be used for a low power signal. For example, Since signal signs 552 and 554 are only routed to component slices 530 and 520 from the local oscillator buffer 416 for the second clock component, the resources previously used for routing signal signs 552 and 554 to component slices 510 can be used for routing low power signals 546 and 548 from local oscillator buffer 414 for the first clock component to component slices 510. Thus one can implement dedicated low power (LP) local oscillator signals 546, 548, 556 and 558. With very little increase of combinational logic, in case of low required output power, only the columns which exclusively serve one component will be activated. Therefore, the LP LO can be routed from buffers 414 and 416 with reduced strength and consuming much less power. Similar strategy can be applied to the line decoder to drive reduced control lines using less power consuming output buffers. In our example implementation, if modulated signals with peak output power $20*\log(((3/4)/1)/4@)\cong 9.54$ dB below the maximum supported by the IQ-RFDAC are expected, the signal can be provided by the low power mode, implemented with only 25% of the rows per component, as well by the high power (HP) mode.

Figure 5C:
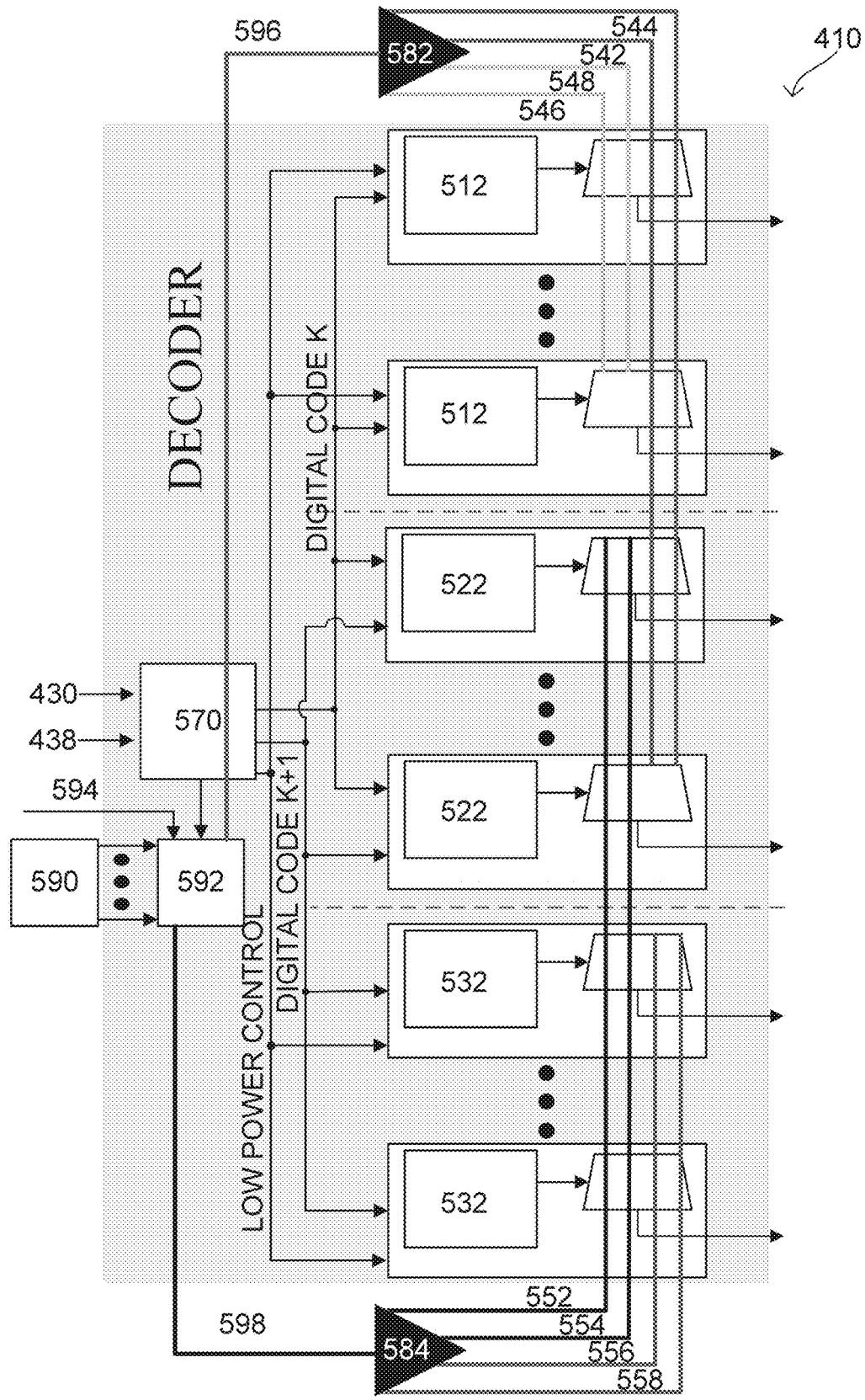

FIG. 5C depicts an exemplary decoder 410 with logic RFDAC. It is possible to implement the decoder to handle more than two clock components as described above. A possible implementation of decoder using this concept and the reduced array range is shown in FIG. 5C. A multiphase clock generator 590 would provide all phases for a phase selector 592, which would pass 2 adjacent phases (here named $\Phi k$ and $\Phi k+1$) to the column slices 510, 520, and 530.

Phase selector 592 is also provided phase selection bits 594 and provides local oscillator signal $\Phi k$ 596 and local oscillator signal $\Phi k+1$ 598 to local oscillator buffers 582 and 584 respectively.

For example, in the case of 60° phase steps in an array 480 which includes 512 unit-cell power amplifiers, the minimum number of unit-cell power amplifiers per component is 444. Assuming an array 480 with 32 rows and 16 columns. In such a case, 28 out of the 32 rows (87.5% of the array) are necessary to be covered by each phase component. Thus, 4 rows would operate on the $\Phi k$ component exclusively with respect to low power mode, 4 rows would operate on the $\Phi k+1$ component exclusively with respect to low power mode, and 24 rows would operate on both the $\Phi k$ component and the $\Phi k+1$ component.

In another example, in the case of 45° phase steps in an array 480 which includes 512 unit-cell power amplifiers, the minimum number of unit-cell per component is 474. Assuming an array 480 with 32 rows and 16 columns. In such a case, 30 out of the 32 rows (93.75% of the array) are necessary to be covered by each phase component. Thus, 2 rows would operate on the $\Phi k$ component exclusively with respect to low power mode, 2 columns $\Phi k+1$ component exclusively with respect to low power mode, and 28 columns are shared by both the $\Phi k$ component and the $\Phi k+1$ component.

The higher the number of phases, the result in less rows that operate exclusively with one phase component using the implementation depicted in FIG. 5C. The implementation will create a smaller load to the LO Buffers 582 and 584, thereby creating savings on power consumption and area.

As an example, if phase steps smaller than 60° are used, it may be possible to generate the low power control signal independent of the phase component coverage.

FIG. 6A depict an exemplary implementable values in an RFDAC. For example, in an IQ-RFDAC with N unit-call power amplifiers in array 480. Implementable values 630A correspond to implementation as depicted in FIG. 4B. In such an implementation, all unit-cells can be shared among both signal phase components. The discrete nature of the cells and columns is ignored. The maximum output power range 620A indicates maximum output power which can be obtained for all signal phases. This constraint arises from the case in which half of the unit-cells (N/2) are operating to service the Q-component and the other half are operating to service the I-component as indicated by 610A. The same would be true for any two phase RFDAC. The clipping of values to the maximum output power achievable for all phases is a usual operation conducted in transmitters and it is useful to reduce the signal peak-to-average power ratio (PAPR) and avoid signal distortions through non-linearity of the amplifier. This limitation in turn results that, for the same number of cells and considering a modulated signal, the IQ-RFDACs can provide 3-dB less peak output power than their polar counterparts. Polar RFDACs can use the entire array to provide signals with all possible phases.

It should be noted that maximum output power 620A is unaffected by the reduced coverage of both clock components across the unit-cell power amplifier array 480 as depicted by 610A and 640A in FIG. 6A.

This explanation is independent of the type of converter. For example, it can apply to switched-capacitor RFDACs and likely for future architectures of RFDACs. However, it should be mentioned that it is possible to add more unit cell power amplifiers to some RFDACs in order to increase output power, while in a switched-capacitor RFDAC the addition of cells usually does not contribute for higher output power.

Figure 6B:
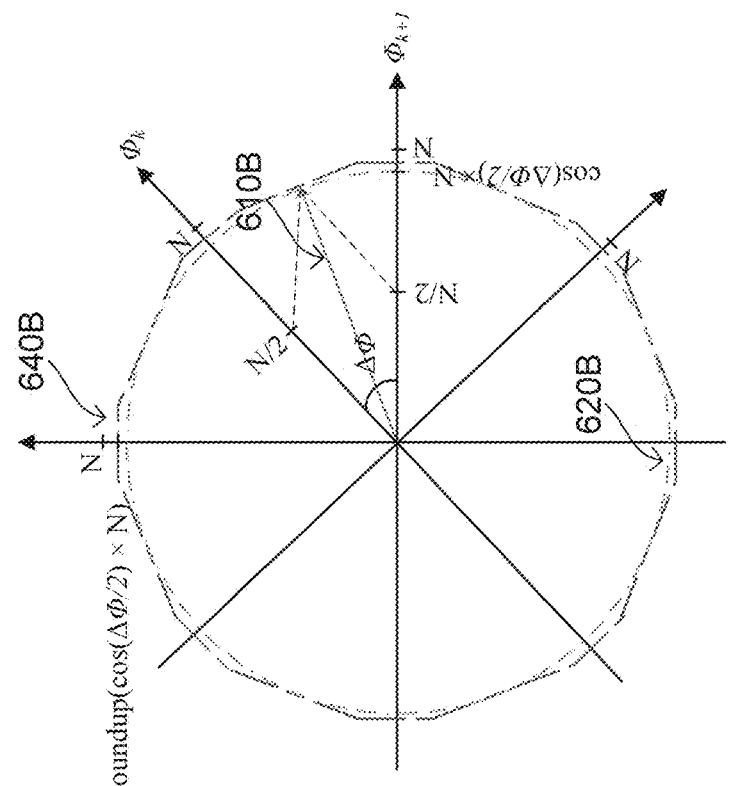
Figure 6B:
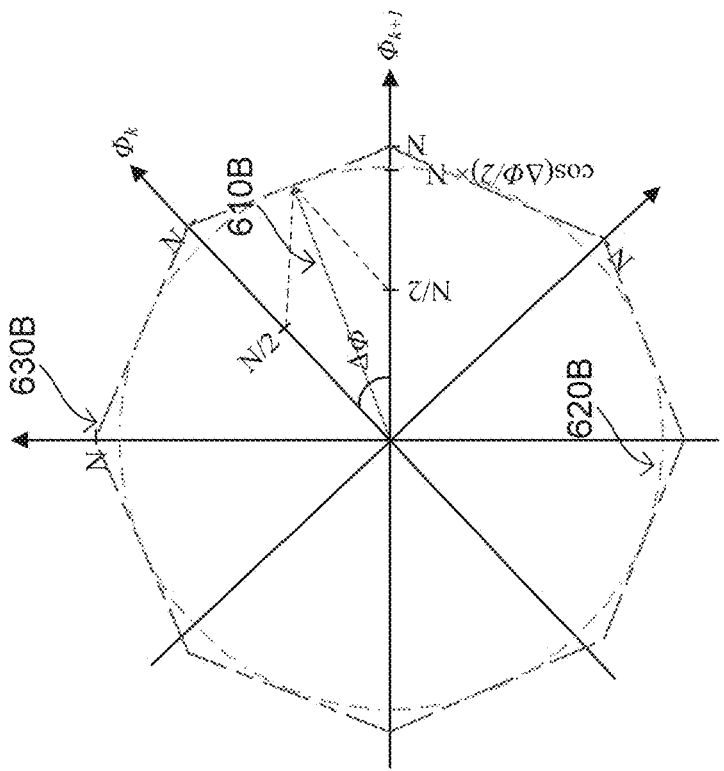

FIG. 6B depict an exemplary implementable values for a multiple phase converter. The maximum number of unit cells per component are limited to $\cos(\Delta\Phi/2)*N$ illustrated circle 620B. Where $\Delta\Phi$ is the difference between adjacent phases in a multi-phase RFDAC.

Figure 7A:
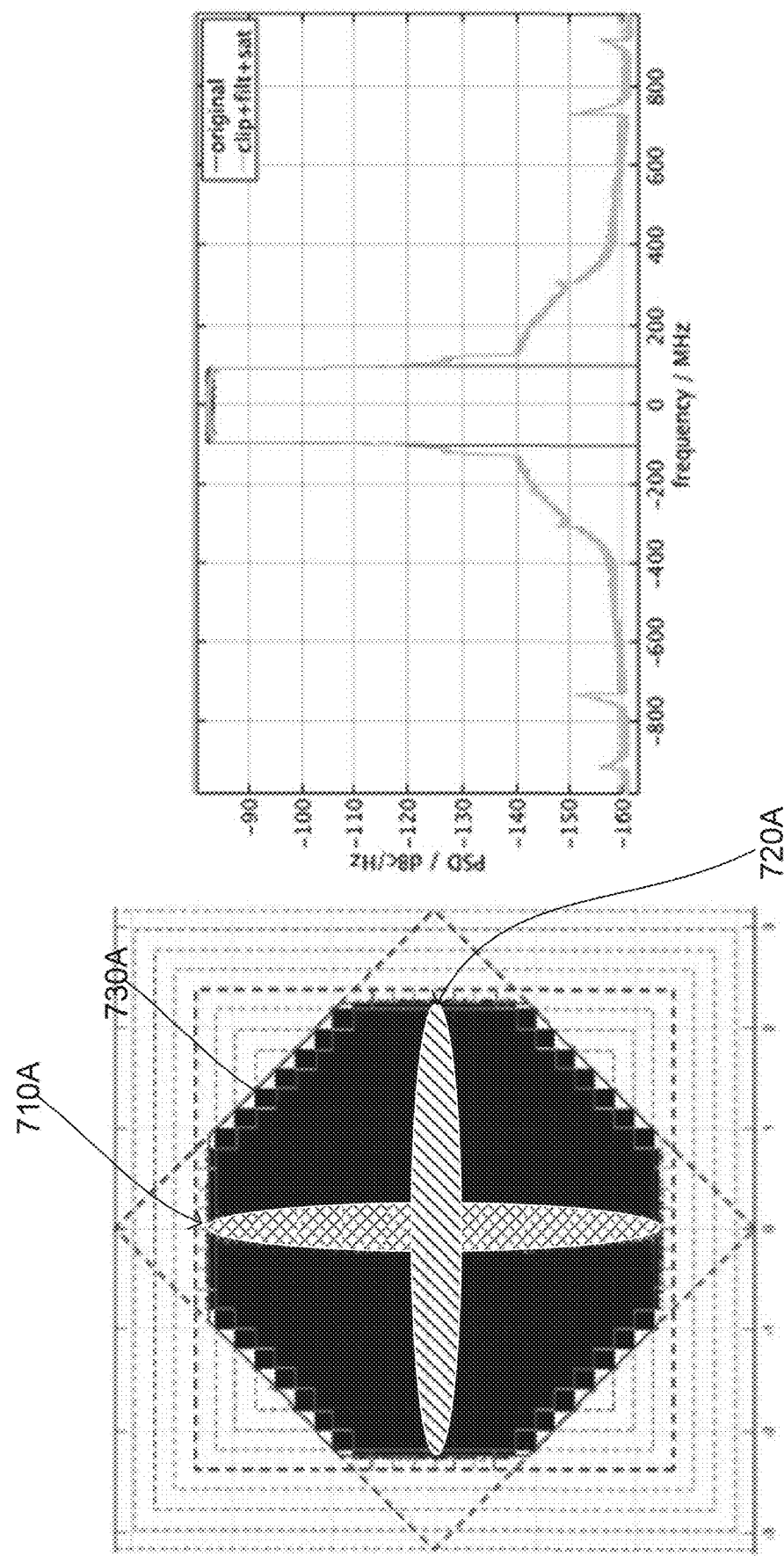
Figure 7C:
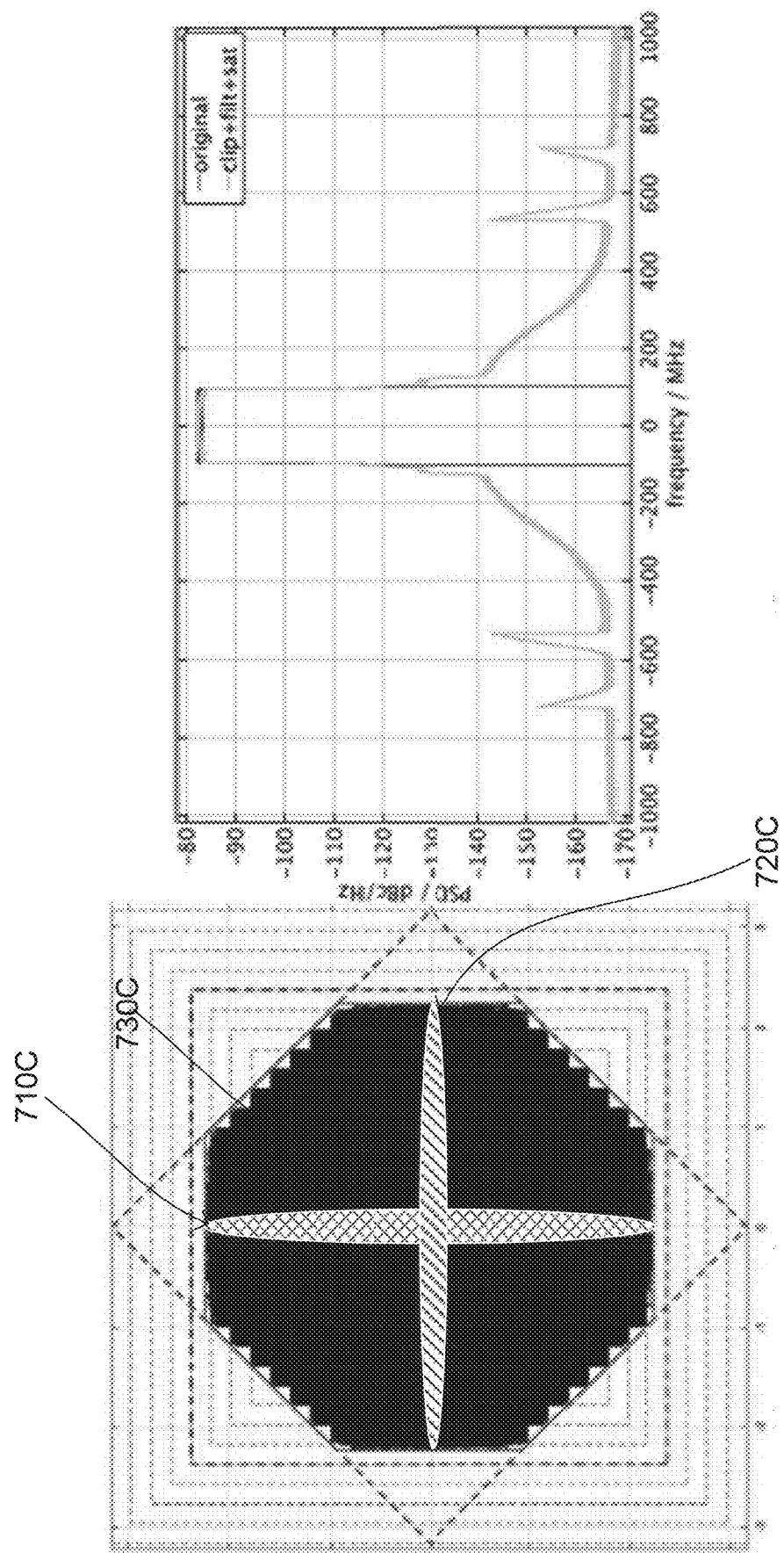

As with a two-phase IQ RFDAC, 630B represents the possible implementable values in case the entire array 480 can be activated in accordance with both clock components. 640B shows the possible limitation of coverage in the array. Rounding up the $\cos(\Delta\Phi/2)*N$ gives the minimum necessary number of unit-cells per component. The absolute minimum limit of the number of unit-cell power amplifiers that need to be considered per clock phase component Validated through system simulations using various standard test signals of this implementation has been confirmed. For example, FIGS. 7A, 7B, and 7C show results of a simulation for an RFDAC. the black points 730A, 730B, and 730C illustrate the code input to the RFDAC after hard clipping to approach the circle of maximum power amplitude 620A for all signal phases. One can notice that the input code approaches an octagonal shape because the input values are limited such that all cells in a row or column of an array operate at a single signal component. The thin dashed lines illustrate the column implementations. The diamond thick dashed line represents the previous limitation placed by number of total unit-cells in the array. The intersection between the diamond and the square thick dashed line considers the new unit-cells array utilization scheme limitation, where each component is restrained to 75% of the array.

FIGS. 7A, 7B, and 7C three identified critical cases for LTE and NR bands. Fehler! Verweisquelle konnte nicht gefunden werden. and 7B illustrate the NR and LTE cases with higher relative bandwidth and Fehler! Verweisquelle konnte nicht gefunden werden. illustrates a case with highest LO frequency and broader bandwidth in sub 6-GHz bands. All simulations consider full resource block (RB) allocation. The LTE signal is quadrature phase shift keying (QPSK) modulated using single-carrier frequency-division multiple access (SC-FDMA). The NR signals are 64-quadrature amplitude modulated (QAM) using cyclic-prefix orthogonal frequency division multiplexing (CP-OFDM). The obtained signal spectra after clipping, filtering and the octagonal like constellation of values are further illustrated.

The values in which the previous or following input codes have different sign are marked in FIGS. 7A, 7B, and 7C as 710A, 720A, 710B, 720B, 710C, and 720C for each of the clock components. In this example, the I and Q components of an IQ RFDAC. The I component is represented by 720A, 720B, and 720C, while the Q component is represented by 710A, 710B, 720B, 710C, and 710C respectively. Thereby, the codes involved in a sign change procedure are emphasized. It is interesting to notice that the shaded areas (710A, 720A, 710B, 720B, 710C, and 720C) are limited to much less than 25% of the columns.

Figure 9:
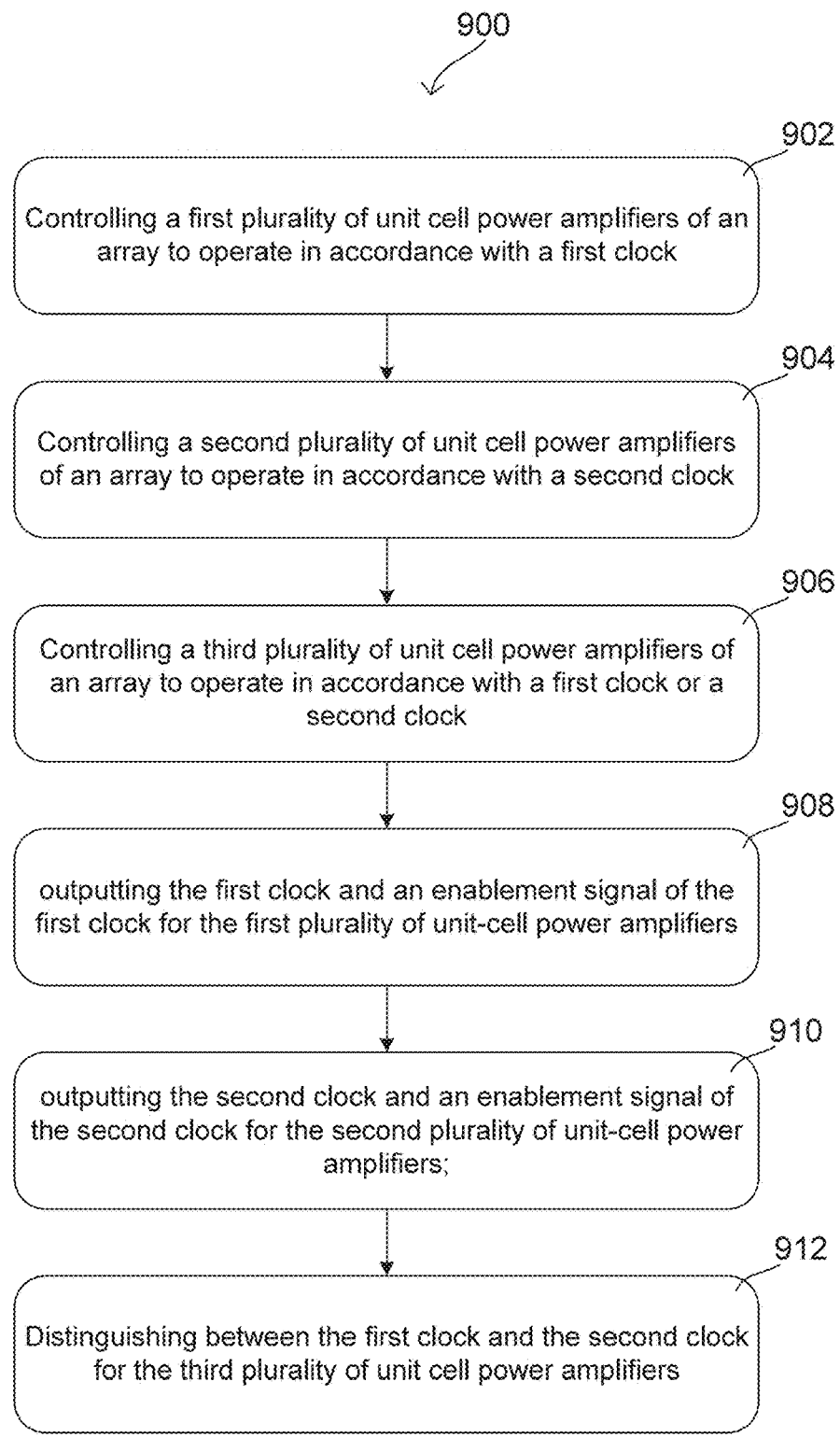
FIG. 9 shows an exemplary flow chart of a method for a RFDAC according to some aspects.

FIG. 9 shows exemplary method 900 of method of controlling an RFDAC. As shown in FIG. 9, method 900 includes Controlling a first plurality of unit cell power amplifiers of an array to operate in accordance with a first clock (902), controlling a second plurality of unit cell power amplifiers of an array to operate in accordance with a second clock (904), controlling a third plurality of unit cell power amplifiers of an array to operate in accordance with a first clock or a second clock (906), outputting a sign of the first clock to the first plurality of unit cell power amplifiers (908), outputting a sign of the second clock to the second plurality of unit cell power amplifiers, (910) and distinguishing between the first clock and the second clock for the third plurality of unit cell power amplifiers (912).

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

Example 1 is a radio frequency converter, the radio frequency converter including an array of unit-cell power amplifiers, wherein the array of unit-cell power amplifiers includes a first plurality of unit-cell power amplifiers, a second plurality of unit-cell power amplifiers, and a third plurality of unit-cell power amplifiers; wherein the first plurality of unit-cell power amplifiers are configured to operate in accordance with a first clock; wherein the second plurality of unit-cell power amplifiers are configured to operate in accordance with a second clock; wherein the third plurality of unit-cell power amplifiers are configured to operate in accordance with the first clock or the second clock; and a decoder configured to: output the first clock and an enablement signal of the first clock for the first plurality of unit-cell power amplifiers; output a the second clock and an enablement signal of the second clock for the second plurality of unit-cell power amplifiers; distinguish between the first clock and the second clock for the third plurality of unit-cell power amplifiers.

In example 2, the subject matter of Example 1 can optionally further include the decoder configured to receive a low power control signal.

In example 3, the subject matter of Examples 1 or 2 can optionally further include the decoder including a plurality of interface registers.

In Example 4, the subject matter of any one of Examples 1 to 3, can optionally further include the decoder including a first combinational logic for the first plurality of unit-cell power amplifiers, a second combinational logic for the second plurality of unit-cell power amplifiers, and a third combinational logic for the third plurality of unit-cell power amplifiers;

In Example 5, the subject matter of any one of Examples 1 to 4, can optionally further include interface registers configured to receive the low power control signal and route the low power control signal to the first combinational logic or the second combinational logic.

In Example 6, the subject matter of any one of Examples 1 to 5, can optionally further include wherein the decoder includes a first local oscillator buffer and a second local oscillator buffer.

In Example 7, the subject matter of any one of Examples 1 to 6 can optionally further include a first line decoder and a second line decoder.

In Example 8, the subject matter of any one of Examples 1 to 7, can optionally further include wherein the first line decoder is configured to: receive a signal from the first local oscillator; activate any unit-cell power amplifier in the first plurality of unit-cell power amplifiers or the third plurality of unit-cell power amplifiers based on the signal from the first local oscillator; and wherein the second line decoder is configured to: receive a signal from the second local oscillator; activate any unit-cell power amplifier in the second plurality of unit-cell power amplifiers or the third plurality of unit-cell power amplifiers based on the signal from the second local oscillator.

In Example 9, the subject matter of any one of Examples 1 to 8, can optionally further include wherein the decoder is further configured to: receive a digital signal; activate a row of unit-cell power amplifiers in the first plurality of unit-cell power amplifiers or the third plurality of unit-cell power amplifiers according to a first clock based on the digital signal; and activate a row of unit-cell power amplifiers in the second plurality of unit-cell power amplifiers or the third plurality of unit-cell power amplifiers according to a second clock based on the digital signal.

In Example 10, the subject matter of any one of Examples 1 to 9, can optionally further include wherein the decoder further includes a phase selector.

In Example 11, the subject matter of any one of Examples 1 to 10, can optionally further include wherein the phase selector is further configured to: receive a plurality of clock phases; receive a plurality of digital signals; receive phase selection bits; produce a first local oscillator signal for the first clock based on at least one of the plurality of clock phases; and produce a second local oscillator signal for the second clock based on at least one of the plurality of clock phases.

In Example 12, the subject matter of any one of Examples 1 to 11, can optionally further include wherein the first local oscillator signal and the second local oscillator signal represent adjacent phases.

In Example 13, the subject matter of any one of Examples 1 to 12, can optionally further include wherein the first oscillator signal is routed to a first local oscillator buffer; and the second oscillator signal is routed to second local oscillator buffer.

In Example 14, the subject matter of any one of Examples 1 to 13, can optionally further include wherein the first plurality of unit-cell power amplifiers are activated in part based on a sign of the first clock; and the second plurality of unit-cell power amplifiers are activated in part based on a sign of the second clock.

In Example 15, the subject matter of any one of Examples 1 to 14, can optionally further include a first plurality of multiplexers, a second plurality of multiplexers, and a third plurality of multiplexers; wherein the first plurality of multiplexers are configured to activate the first plurality of unit-cell power amplifiers; wherein the second plurality of multiplexers are configured to activate the second plurality of unit-cell power amplifiers; wherein the third plurality of multiplexers are configured to activate the third plurality of unit-cell power amplifiers In Example 16, the subject matter of any one of Examples 1 to 15, can optionally further include wherein the first plurality of multiplexers are configured to activate the first plurality of unit-cell power amplifiers based on the sign change in a low power mode; wherein the second plurality of multiplexers are configured to activate the second plurality of unit-cell power amplifiers based on the sign change in the lower power mode; wherein the third plurality of multiplexers are configured to activate the third plurality of unit-cell power amplifiers based on a component signal for the first clock or the second clock.

Example 17 is a system for converting a digital signal to and analog radio frequency, system including an array of unit-cell power amplifiers, wherein the array of unit-cell power amplifiers includes a first plurality of unit-cell power amplifiers, a second plurality of unit-cell power amplifiers, and a third plurality of unit-cell power amplifiers; wherein the first plurality of unit-cell power amplifiers are configured to operate in accordance with a first clock; wherein the second plurality of unit-cell power amplifiers are configured to operate in accordance with a second clock; wherein the third plurality of unit-cell power amplifiers are configured to operate in accordance with the first clock or the second clock; and a decoder configured to: output the first clock and an enablement signal of the first clock for the first plurality of unit-cell power amplifiers; output the second clock and an enablement signal of the second clock for the second plurality of unit-cell power amplifiers; distinguish between the first clock and the second clock for the third plurality of unit-cell power amplifiers.

In example 18, the subject matter of Example 17 can optionally further include the decoder configured to receive a low power control signal.

In example 19, the subject matter of Examples 17 or 18 can optionally further include the decoder including a plurality of interface registers.

In Example 20, the subject matter of any one of Examples 17 to 19, can optionally further include the decoder including a first combinational logic for the first plurality of unit-cell power amplifiers, a second combinational logic for the second plurality of unit-cell power amplifiers, and a third combinational logic for the third plurality of unit-cell power amplifiers;

In Example 21, the subject matter of any one of Examples 17 to 20, can optionally further include interface registers configured to receive the low power control signal and route the low power control signal to the first combinational logic or the second combinational logic.

In Example 22, the subject matter of any one of Examples 17 to 21, can optionally further include wherein the decoder includes a first local oscillator buffer and a second local oscillator buffer.

In Example 23, the subject matter of any one of Examples 17 to 22 can optionally further include a first line decoder and a second line decoder.

In Example 24, the subject matter of any one of Examples 17 to 23, can optionally further include wherein the first line decoder is configured to: receive a signal from the first local oscillator; activate any unit-cell power amplifier in the first plurality of unit-cell power amplifiers or the third plurality of unit-cell power amplifiers based on the signal from the first local oscillator; and wherein the second line decoder is configured to: receive a signal from the second local oscillator; activate any unit-cell power amplifier in the second plurality of unit-cell power amplifiers or the third plurality of unit-cell power amplifiers based on the signal from the second local oscillator.

In Example 25, the subject matter of any one of Examples 17 to 24, can optionally further include wherein the decoder is further configured to: receive a digital signal; activate any unit-cell power amplifiers in the first plurality of unit-cell power amplifiers or the third plurality of unit-cell power amplifiers according to a first clock based on the digital signal; and activate any unit-cell power amplifiers in the second plurality of unit-cell power amplifiers or the third plurality of unit-cell power amplifiers according to a second clock based on the digital signal.

In Example 26, the subject matter of any one of Examples 17 to 25, can optionally further include wherein the decoder further includes a phase selector.

In Example 27, the subject matter of any one of Examples 17 to 26, can optionally further include wherein the phase selector is further configured to: receive a plurality of clock phases; receive a plurality of digital signals; receive phase selection bits; produce a first local oscillator signal for the first clock based on at least one of the plurality of clock phases; and produce a second local oscillator signal for the second clock based on at least one of the plurality of clock phases.

In Example 28, the subject matter of any one of Examples 17 to 27, can optionally further include wherein the first local oscillator signal and the second local oscillator signal represent adjacent phases.

In Example 29, the subject matter of any one of Examples 17 to 28, can optionally further include wherein the first oscillator signal is routed to a first local oscillator buffer; and the second oscillator signal is routed to second local oscillator buffer.

In Example 30, the subject matter of any one of Examples 17 to 29, can optionally further include wherein the first plurality of unit-cell power amplifiers are activated in part based on a sign of the first clock; and the second plurality of unit-cell power amplifiers are activated in part based on a sign of the second clock.

In Example 31, the subject matter of any one of Examples 17 to 30, can optionally further include a first plurality of multiplexers, a second plurality of multiplexers, and a third plurality of multiplexers; wherein the first plurality of multiplexers are configured to activate the first plurality of unit-cell power amplifiers; wherein the second plurality of multiplexers are configured to activate the second plurality of unit-cell power amplifiers; wherein the third plurality of multiplexers are configured to activate the third plurality of unit-cell power amplifiers In Example 32, the subject matter of any one of Examples 17 to 31, can optionally further include wherein the first plurality of multiplexers are configured to activate the first plurality of unit-cell power amplifiers based on the sign change in a low power mode; wherein the second plurality of multiplexers are configured to activate the second plurality of unit-cell power amplifiers based on the sign change in the lower power mode; wherein the third plurality of multiplexers are configured to activate the third plurality of unit-cell power amplifiers based on a component signal for the first clock or the second clock.

Example 33 is a means for converting a digital signal to analog radio frequency the means including an array of unit-cell power amplifiers, wherein the array of unit-cell power amplifiers includes a first plurality of unit-cell power amplifiers, a second plurality of unit-cell power amplifiers, and a third plurality of unit-cell power amplifiers; wherein the first plurality of unit-cell power amplifiers are configured to operate in accordance with a first clock; wherein the second plurality of unit-cell power amplifiers are configured to operate in accordance with a second clock; wherein the third plurality of unit-cell power amplifiers are configured to operate in accordance with the first clock or the second clock; and a decoder configured to: output the first clock and an enablement signal of the first clock for the first plurality of unit-cell power amplifiers; output the second clock and an enablement signal of the second clock for the second plurality of unit-cell power amplifiers; distinguish between the first clock and the second clock for the third plurality of unit-cell power amplifiers.

In example 34, the subject matter of Example 33 can optionally further include the decoder configured to receive a low power control signal.

In example 35, the subject matter of Examples 33 or 34 can optionally further include the decoder including a plurality of interface registers.

In Example 36, the subject matter of any one of Examples 33 to 35, can optionally further include the decoder including a first combinational logic for the first plurality of unit-cell power amplifiers, a second combinational logic for the second plurality of unit-cell power amplifiers, and a third combinational logic for the third plurality of unit-cell power amplifiers;

In Example 37, the subject matter of any one of Examples 33 to 36, can optionally further include interface registers configured to receive the low power control signal and route the low power control signal to the first combinational logic or the second combinational logic.

In Example 38, the subject matter of any one of Examples 33 to 37, can optionally further include wherein the decoder includes a first local oscillator buffer and a second local oscillator buffer.

In Example 39, the subject matter of any one of Examples 33 to 38 can optionally further include a first line decoder and a second line decoder.

In Example 40, the subject matter of any one of Examples 33 to 39, can optionally further include wherein the first line decoder is configured to: receive a signal from the first local oscillator; activate any unit-cell power amplifier in the first plurality of unit-cell power amplifiers or the third plurality of unit-cell power amplifiers based on the signal from the first local oscillator; and wherein the second line decoder is configured to: receive a signal from the second local oscillator; activate any unit-cell power amplifier in the second plurality of unit-cell power amplifiers or the third plurality of unit-cell power amplifiers based on the signal from the second local oscillator.

In Example 41, the subject matter of any one of Examples 33 to 39, can optionally further include wherein the decoder is further configured to: receive a digital signal; activate any unit-cell power amplifiers in the first plurality of unit-cell power amplifiers or the third plurality of unit-cell power amplifiers according to a first clock based on the digital signal; and activate any unit-cell power amplifiers in the second plurality of unit-cell power amplifiers or the third plurality of unit-cell power amplifiers according to a second clock based on the digital signal.

In Example 42, the subject matter of any one of Examples 33 to 40, can optionally further include wherein the decoder further includes a phase selector.

In Example 43, the subject matter of any one of Examples 33 to 41, can optionally further include; wherein the phase selector is further configured to: receive a plurality of clock phases; receive a plurality of digital signals; receive phase selection bits; produce a first local oscillator signal for the first clock based on at least one of the plurality of clock phases; and produce a second local oscillator signal for the second clock based on at least one of the plurality of clock phases.

In Example 44, the subject matter of any one of Examples 33 to 42, can optionally further include wherein the first local oscillator signal and the second local oscillator signal represent adjacent phases.

In Example 45, the subject matter of any one of Examples 33 to 43, can optionally further include wherein the first oscillator signal is routed to a first local oscillator buffer; and the second oscillator signal is routed to second local oscillator buffer.

In Example 46, the subject matter of any one of Examples 33 to 44, can optionally further include wherein the first plurality of unit-cell power amplifiers are activated in part based on a sign of the first clock; and the second plurality of unit-cell power amplifiers are activated in part based on a sign of the second clock.

In Example 47, the subject matter of any one of Examples 33 to 45, can optionally further include a first plurality of multiplexers, a second plurality of multiplexers, and a third plurality of multiplexers; wherein the first plurality of multiplexers are configured to activate the first plurality of unit-cell power amplifiers; wherein the second plurality of multiplexers are configured to activate the second plurality of unit-cell power amplifiers; wherein the third plurality of multiplexers are configured to activate the third plurality of unit-cell power amplifiers In Example 48, the subject matter of any one of Examples 33 to 46, can optionally further include wherein the first plurality of multiplexers are configured to activate the first plurality of unit-cell power amplifiers based on the sign change in a low power mode; wherein the second plurality of multiplexers are configured to activate the second plurality of unit-cell power amplifiers based on the sign change in the lower power mode; wherein the third plurality of multiplexers are configured to activate the third plurality of unit-cell power amplifiers based on a component signal for the first clock or the second clock.

Example 49 is a method of controlling a radio frequency converter including: controlling a first plurality of unit-cell power amplifiers are configured to operate in accordance with a first clock; controlling a second plurality of unit-cell power amplifiers are configured to operate in accordance with a second clock; controlling a third plurality of unit-cell power amplifiers are configured to operate in accordance with the first clock or the second clock; and outputting the first clock and an enablement signal of the first clock for the first plurality of unit-cell power amplifiers; outputting the second clock and an enablement signal of the second clock for the second plurality of unit-cell power amplifiers; distinguishing between the first clock and the second clock for the third plurality of unit-cell power amplifiers.

In example 50, the subject matter of Example 49 can optionally further include the receiving low power control signal.

In example 51, the subject matter of Examples 49 or 50 can optionally further include controlling a plurality of interface registers to route a low power signal to a first combinational logic or a second combinational logic.

In example 52, the subject matter of any one of Examples 49 or 51 can optionally further controlling a plurality of interface registers to route a first clock to a first combinational logic and a third combinational logic; and route a second clock to a second combinational logic and a third combinational logic.

In Example 53, the subject matter of any one of Examples 49 to 52, can optionally further include the controlling a first combinational logic to activate the first plurality of unit-cell power amplifiers, controlling a second combinational logic to activate the second plurality of unit-cell power amplifiers, and controlling a third combinational logic to activate the third plurality of unit-cell power amplifiers;

In Example 54, the subject matter of any one of Examples 49 to 53, can optionally further include receiving a low power control signal and routing the low power control signal to the first combinational logic or the second combinational logic.

In Example 55, the subject matter of any one of Examples 49 to 54, can optionally further include buffering a first local oscillator signal and buffering a second local oscillator signal.

In Example 56, the subject matter of any one of Examples 49 to 55, can optionally further include decoding a first local oscillator signal and decoding a second local oscillator signal.

In Example 57, the subject matter of any one of Examples 49 to 56, can optionally further include receiving a signal from the first local oscillator and activating any unit-cell power amplifier in the first plurality of unit-cell power amplifiers or the third plurality of unit-cell power amplifiers based on the signal from the first local oscillator; and receiving a signal from the second local oscillator and activating any unit-cell power amplifier in the second plurality of unit-cell power amplifiers or the third plurality of unit-cell power amplifiers based on the signal from the second local oscillator.

In Example 58, the subject matter of any one of Examples 49 to 57, can optionally further include receiving a digital signal; activating any unit-cell power amplifiers in the first plurality of unit-cell power amplifiers or the third plurality of unit-cell power amplifiers according to a first clock based on the digital signal; and activating any unit-cell power amplifiers in the second plurality of unit-cell power amplifiers or the third plurality of unit-cell power amplifiers according to a second clock based on the digital signal.

In Example 59, the subject matter of any one of Examples 49 to 58, can optionally further include selecting a clock phase from a plurality of clock phases.

In Example 60, the subject matter of any one of Examples 49 to 59, can optionally further include receiving a plurality of clock phases; receiving a plurality of digital signals; receiving phase selection bits; producing a first local oscillator signal for the first clock based on at least one of the plurality of clock phases; and producing a second local oscillator signal for the second clock based on at least one of the plurality of clock phases.

In Example 61, the subject matter of any one of Examples 49 to 60, can optionally further include wherein producing a first local oscillator signal and producing a second local oscillator signal based on adjacent phases.

In Example 62, the subject matter of any one of Examples 49 to 61, can optionally further include routing the first oscillator signal to a first local oscillator buffer; and routing the second oscillator signal to second local oscillator buffer.

In Example 63, the subject matter of any one of Examples 49 to 62, can optionally further include activating the first plurality of unit-cell power amplifiers based in part on a sign of the first clock; and activating the second plurality of unit-cell power amplifiers based in part on a sign of the second clock.

In Example 64, the subject matter of any one of Examples 49 to 63, can optionally further include controlling a first plurality of multiplexers to activate the first plurality of unit-cell power amplifiers; controlling a second plurality of multiplexers to activate the second plurality of unit-cell power amplifiers; and controlling a third plurality of multiplexers to activate the third plurality of unit-cell power amplifiers In Example 65, the subject matter of any one of Examples 49 to 64, can optionally further include controlling a first plurality multiplexers to activate the first plurality of unit-cell power amplifiers based on the sign change in a low power mode; controlling the second plurality of multiplexers to activate the second plurality of unit-cell power amplifiers based on the sign change in the lower power mode; wherein the third plurality of multiplexers are configured to activate the third plurality of unit-cell power amplifiers based on a component signal for the first clock or the second clock.

Example 66 is a non-transitory computer readable medium storing instructions thereon, that when executed by one or more processors of a convertor, cause the convertor to perform the method of any one of Examples 49 to 64.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A radio frequency converter comprising:
an array of unit-cell power amplifiers, wherein the array of unit-cell power amplifiers comprises a first plurality of unit-cell power amplifiers, a second plurality of unit-cell power amplifiers, and a third plurality of unit-cell power amplifiers;
wherein the first plurality of unit-cell power amplifiers is configured to operate in accordance with a first clock;
wherein the second plurality of unit-cell power amplifiers is configured to operate in accordance with a second clock;
wherein the third plurality of unit-cell power amplifiers is configured to operate in accordance with the first clock or the second clock; and
a decoder configured to:
output the first clock and an enablement signal of the first clock for the first plurality of unit-cell power amplifiers;
output the second clock and an enablement signal of the second clock for the second plurality of unit-cell power amplifiers; and
distinguish between the first clock and the second clock for the third plurality of unit-cell power amplifiers.

2. The radio frequency converter of claim 1, further comprising a plurality of interface registers configured to receive a low power control signal and receive a digital code.

3. The radio frequency converter of claim 2, wherein the plurality of interface registers is configured to:
route the low power control signal;
route a first clock of the digital code; and
route a second clock of the digital code.

4. The radio frequency converter of claim 3, wherein the decoder comprises a first combinational logic for the first plurality of unit-cell power amplifiers, a second combinational logic for the second plurality of unit-cell power amplifiers, and a third combinational logic for the third plurality of unit-cell power amplifiers;
wherein the first clock of the digital code is routed from the plurality of interface registers to the first combinational logic;
wherein the second clock of the digital code is routed from the plurality of interface registers to the second combinational logic; and
wherein the first clock of the digital code and the second clock of the digital code are routed from the plurality of interface registers to the third combinational logic.

5. The radio frequency converter of claim 4, wherein the interface registers are configured to receive the low power control signal and route the low power control signal to the first combinational logic or the second combinational logic.

6. The radio frequency converter of claim 1, wherein the decoder further comprises a first local oscillator buffer and a second local oscillator buffer.

7. The radio frequency converter of claim 6, further comprising a first line decoder and a second line decoder.

8. The radio frequency converter of claim 7,
wherein the first line decoder is configured to:
receive a signal from the first local oscillator;
activate any unit-cell power amplifier in the first plurality of unit-cell power amplifiers or the third plurality of unit-cell power amplifiers based on the signal from the first local oscillator; and
wherein the second line decoder is configured to:
receive a signal from the second local oscillator;
activate any unit-cell power amplifier in the second plurality of unit-cell power amplifiers or the third plurality of unit-cell power amplifiers based on the signal from the second local oscillator.

9. The radio frequency converter of claim 1,
wherein the decoder is further configured to:
receive a digital signal;
activate any unit-cell power amplifiers in the first plurality of unit-cell power amplifiers or the third plurality of unit-cell power amplifiers according to a first clock based on the digital signal; and
activate any unit-cell power amplifiers in the second plurality of unit-cell power amplifiers or the third plurality of unit-cell power amplifiers according to a second clock based on the digital signal.

10. The radio frequency converter of claim 1, wherein the decoder further comprises a phase selector.

11. The radio frequency converter of claim 10,
wherein the phase selector is further configured to:
receive a plurality of clock phases;
receive a plurality of digital signals;
receive phase selection bits;
produce a first local oscillator signal for the first clock based on at least one of the plurality of clock phases; and
produce a second local oscillator signal for the second clock based on at least one of the plurality of clock phases.

12. The radio frequency converter of claim 11, wherein the first local oscillator signal and the second local oscillator signal represent adjacent phases.

13. The radio frequency converter of claim 12, wherein the first oscillator signal is routed to a first local oscillator buffer; and the second oscillator signal is routed to second local oscillator buffer.

14. The radio frequency converter of claim 13, wherein the first local oscillator buffer is configured to output the enablement signal of the first clock; and the second local oscillator buffer is configured to output the enablement signal of the second clock.

15. A method of controlling a radio frequency converter comprising:
controlling a first plurality of unit-cell power amplifiers to operate in accordance with a first clock;
controlling a second plurality of unit-cell power amplifiers to operate in accordance with a second clock;
controlling a third plurality of unit-cell power amplifiers to operate in accordance with the first clock or the second clock;
outputting the first clock and an enablement signal of the first clock for the first plurality of unit-cell power amplifiers;
outputting the second clock and an enablement signal of the second clock for the second plurality of unit-cell power amplifiers; and
distinguishing between the first clock and the second clock for the third plurality of unit-cell power amplifiers.

16. The method of claim 15, further comprising receiving a low power control signal.

17. The method of claim 16, further comprising receiving the lower power control signal; and routing the lower power control signal to the first combinational logic or the second combinational logic.

18. The method of claim 17, further comprising:
activating any unit-cell power amplifier in the first plurality of unit-cell power amplifiers or the third plurality of unit-cell power amplifiers based on a received signal from a first local oscillator; and
activating any unit-cell power amplifier in the second plurality of unit-cell power amplifiers or the third plurality of unit-cell power amplifiers based on a received signal from a second local oscillator.

19. The method of claim 18, further comprising:
receiving a digital signal;
activating any unit-cell power amplifiers in the first plurality of unit-cell power amplifiers or the third plurality of unit-cell power amplifiers according to a first clock based on the digital signal; and
activating any unit-cell power amplifiers in the second plurality of unit-cell power amplifiers or the third plurality of unit-cell power amplifiers according to a second clock based on the digital signal.

20. The method of claim 17, further comprising:
controlling a first plurality of multiplexors to activate the first plurality of unit-cell power amplifiers based on a sign of the first clock;
controlling a second plurality of multiplexors to partially activate the second plurality of unit-cell power amplifiers based on a sign of the second clock; and
controlling a third plurality of multiplexors to partially activate the third plurality of unit-cell power amplifiers based on the first clock or the second clock.

* * * * *